US012733152B2

(12) United States Patent
Cai et al.

(10) Patent No.: US 12,733,152 B2
(45) Date of Patent: Sep. 8, 2026

(54) SEMICONDUCTOR DEVICES HAVING DESIGNED BIT LINES AND FABRICATING METHODS THEREOF

(71) Applicant: YANGTZE MEMORY TECHNOLOGIES CO., LTD., Wuhan (CN)

(72) Inventors: Zhiyong Cai, Wuhan (CN); Ziyu Zhang, Wuhan (CN); Kang Yang, Wuhan (CN); Hsing-An Lo, Wuhan (CN); Yi Zhou, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 416 days.

(21) Appl. No.: 18/226,159

(22) Filed: Jul. 25, 2023

(65) Prior Publication Data

US 2024/0049458 A1 Feb. 8, 2024

Related U.S. Application Data

(60) Provisional application No. 63/394,948, filed on Aug. 3, 2022.

(30) Foreign Application Priority Data

Jul. 17, 2023 (CN) ........................ 202310877961.X

(51) Int. Cl.
*H10B 12/00* (2023.01)

(52) U.S. Cl.
CPC ........... *H10B 12/488* (2023.02); *H10B 12/05* (2023.02); *H10B 12/312* (2023.02); *H10B 12/482* (2023.02)

(58) Field of Classification Search
CPC ...... H10B 12/05; H10B 12/30; H10B 12/312; H10B 12/373; H10B 12/48; H10B 12/482; H10B 12/488; H10B 12/50; H10D 30/025; H10D 30/63
See application file for complete search history.

(56) References Cited

U.S. PATENT DOCUMENTS

2023/0164977 A1* 5/2023 Sung ...................... H10B 12/03 257/295
2023/0276639 A1* 8/2023 Pola ...................... H10B 63/10 257/5

* cited by examiner

*Primary Examiner* — Hoai V Pham
(74) *Attorney, Agent, or Firm* — BAYES PLLC

(57) ABSTRACT

Three-dimensional (3D) semiconductor devices and fabricating methods are provided. In some implementations, a disclosed semiconductor device comprises: an array of vertical transistors each comprising a semiconductor body extending in a vertical direction; a plurality of word lines each extending along a first lateral direction and comprising a plurality of gate structures of a row of the array of vertical transistors arranged in the first lateral direction; and a plurality of bit lines each extending along a second lateral direction different from the first lateral direction and comprising silicide.

21 Claims, 37 Drawing Sheets

300A

300A

300B

400

500

SEMICONDUCTOR DEVICES HAVING DESIGNED BIT LINES AND FABRICATING METHODS THEREOF

CROSS-REFERENCE TO RELATED APPLICATIONS

This application claims the benefit of priorities to C.N. Application No. 202310877961.X, filed on Jul. 17, 2023, and U.S. Provisional Application No. 63/394,948, filed on Aug. 3, 2022, both of which are hereby incorporated by reference in their entireties.

TECHNICAL FIELD

The present disclosure generally relates to the field of semiconductor technology, and more particularly, to semiconductor devices and fabricating methods thereof.

BACKGROUND

Planar memory cells are scaled to smaller sizes by improving process technology, circuit design, programming algorithm, and fabrication process. However, as feature sizes of the memory cells approach a lower limit, planar process, and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In some implementations, a semiconductor device comprises: an array of vertical transistors each comprising a semiconductor body extending in a vertical direction; a plurality of word lines each extending along a first lateral direction and comprising a plurality of gate structures of a row of the array of vertical transistors arranged in the first lateral direction; and a plurality of bit lines each extending along a second lateral direction different from the first lateral direction and comprising silicide.

In some implementations, each bit line comprises a silicide line having a thickness in the vertical direction in a range between about 10 nm and about 30 nm.

In some implementations, each bit line comprises a silicide line having a first thickness in the vertical direction and a metal line having a second thickness greater than the first thickness in the vertical direction.

In some implementations, the silicide is a metal silicide including at least one element from Co, Ti, and Ni.

In some implementations, the semiconductor device further comprises: an array of memory cells each comprising: one of the vertical transistors; and a storage unit coupled with a first end of the semiconductor body of the one of the vertical transistors, wherein a second end of the semiconductor body of the one of the vertical transistors is coupled with one corresponding bit line.

In some implementations, each bit line is coupled with a common region at the second ends of the semiconductor bodies of a pair of vertical transistors.

In some implementations, plurality of first spacers each extending along the first lateral direction between pairs of the vertical transistors.

In some implementations, the plurality of word lines are embedded in the plurality of first spacers; and two adjacent word lines are embedded in one same first spacer.

In some implementations, the semiconductor device further comprises: a plurality of second spacers each extending along the first lateral direction between two rows of the vertical transistors that form pairs of the vertical transistors.

In some implementations, the second lateral direction is perpendicular to the first lateral direction; and the plurality of first spacers and second spacers are alternatively arranged along the second lateral direction.

In some implementations, each of the plurality of first spacers or second spacers comprises a first air gap extending along the first lateral direction.

In some implementations, adjacent bit lines are separated by a second air gap extending along the second lateral direction.

In some implementations, a method of forming a semiconductor device comprises forming a semiconductor structure comprising a semiconductor layer on an array of semiconductor bodies; thinning the semiconductor layer to form a plurality of semiconductor walls separated by a plurality of spacers; removing portions of the spacers to expose portions of the plurality of semiconductor walls; and transforming the exposed portions of the plurality of semiconductor walls to a plurality of bit lines.

In some implementations, the method further comprises forming a plurality of word lines each extending along a first lateral direction between adjacent rows of semiconductor bodies.

In some implementations, thinning the semiconductor layer comprises removing a portion of the semiconductor layer, such that a remaining portion of the semiconductor layer comprises the plurality of semiconductor walls each extending in parallel along a second lateral direction perpendicular to the first lateral direction and in contact with a corresponding column of semiconductor bodies.

In some implementations, the method further comprises forming a plurality of isolation structures between adjacent bit lines.

In some implementations, forming the plurality of isolation structures comprises forming an air gap extending along the second lateral direction in each isolation structure.

In some implementations, transforming the exposed portions of the plurality of semiconductor walls to the plurality of bit lines comprises performing a metal-silicide process to deposit and defuse a metal element into the exposed portions of the plurality of semiconductor walls.

In some implementations, the method further comprises before transforming the exposed portions of the plurality of semiconductor walls to the plurality of bit lines, doping joint portions of each semiconductor wall and the corresponding column of semiconductor bodies.

In some implementations, a semiconductor system comprises: an array of memory cells each comprising: a vertical transistor each comprising a semiconductor body extending in a vertical direction, and a storage unit in electrical connection with a first end of the semiconductor body; a plurality of word lines each extending along a first lateral direction and comprising a plurality of gate structures of a row of vertical transistors arranged in the first lateral direction; and a plurality of bit lines each extending along a second lateral direction different from the first lateral direction and comprising silicide; and a memory controller configured to control the array of memory cells through the plurality of word lines and the plurality of bit lines.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

Figure 1:
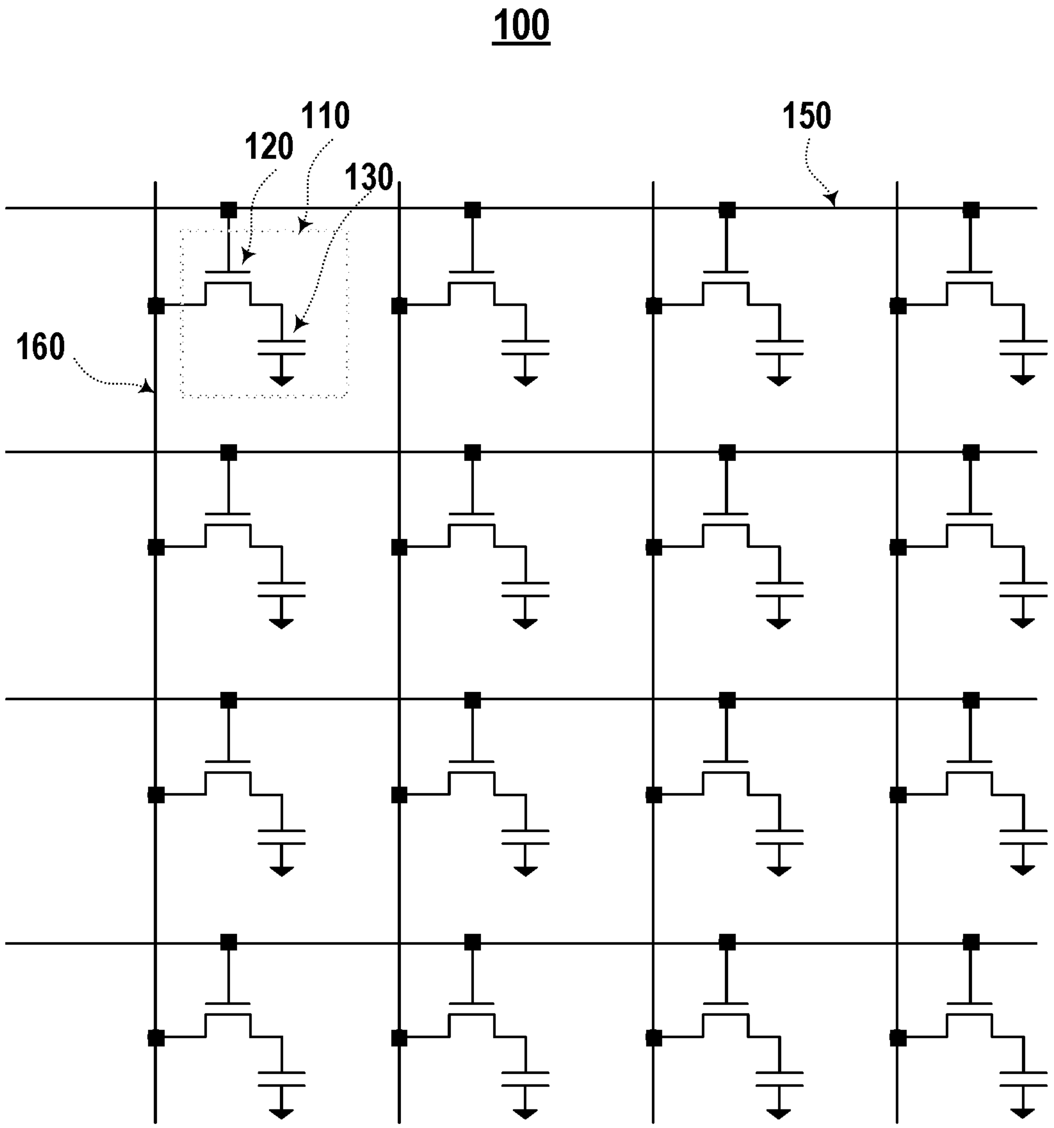
FIG. 1 illustrates a schematic circuit diagram of a memory device including an array of memory cells each having a vertical transistor, according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as dynamic radon access memory (DRAM), phase-change memory (PCM), and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

To address one or more of the aforementioned issues, the present disclosure introduces a solution in which vertical transistors replace the conventional planar transistors as the switch and selecting devices in a memory cell array of memory devices (e.g., DRAM, PCM, and FRAM). In the following descriptions, DRAM is used as a non-exclusive example of the present disclosure. Compared with planar transistors, the vertically arranged transistors (i.e., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and one below the transistors), such that the process margin of the bit lines can be increased and the coupling capacitance between the bit lines and the storage units can be decreased.

Consistent with the scope of the present disclosure, according to some implementations of the present disclosure, the memory cell array having vertical transistors each comprising a semiconductor body extending in a vertical direction, and a gate structure beside the semiconductor structure. In some implementations, the word lines and bit lines connected to the vertical transistors are arranged along a first lateral direction and a second lateral direction, respectively. Each of the semiconductor bodies of the array of vertical transistors extends along a vertical direction. By using such an arrangement, memory area efficiency can be increased. Further, the memory cell array and the peripheral circuits can be formed separately on different wafers, such that the fabricating processes of the memory cell array and the peripheral circuits do not affect each other, and the memory area efficiency can be further increased. Due to the particularity of the structure and the strict requirements of alignment, the bit lines are formed in a very small size, and an air gap is formed between adjacent bit lines to reduce the resistance capacitor delay (RC delay) effect and to improve the performance of the device. In some implementations of the present disclosure, each bit line can include a metal line and a metal silicide line. In some implementations of the present disclosure, each bit line can consist of a metal silicide line without a metal line.

FIG. 1 illustrates a schematic diagram of a memory device 100 having an array of memory cells each having a vertical transistor, according to some implementations of the present disclosure. Memory device 100 can include a memory cell array in which each memory cell 110 includes a vertical transistor 120 and a storage unit coupled to vertical transistor 120. In some implementations as shown in FIG. 1, the memory cell array is a DRAM cell array, and the storage unit is a capacitor 130 for storing charge as the binary information stored by the respective DRAM cell. In some other implementations not shown in the figures, the memory cell array is a PCM cell array, and the storage unit can be a PCM element (e.g., including chalcogenide alloys) for storing binary information of the respective PCM cell based on the different resistivities of the PCM element in the amorphous phase and the crystalline phase. In some implementations not shown in the figures, the memory cell array is a FRAM cell array, and the storage unit can be a ferroelectric capacitor for storing binary information of the respective FRAM cell based on the switch between two polarization states of ferroelectric materials under an external electric field.

As shown in FIG. 1, memory cells 110 can be arranged in a two-dimensional (2D) array having rows and columns. Memory device 100 can include word lines 150 coupling the memory cell array to peripheral circuits for controlling the switch of vertical transistors 120 in memory cells 110 located in a row, as well as bit lines 160 coupling the memory cell array to peripheral circuits for sending data to and/or receiving data from memory cells 110 located in a column. That is, each word line 150 is coupled to a respective row of memory cells 110, and each bit line 160 is coupled to one or more respective logic columns of memory cells 110. In some implementations, the gate of vertical transistor 120 is coupled to word line 150, one of the source and the drain of vertical transistor 120 is coupled to bit line 160, the other one of the source and the drain of vertical transistor 120 is coupled to one electrode of capacitor 130, and the other electrode of capacitor 130 is coupled to the ground.

Consistent with the scope of the present disclosure, vertical transistors 120, such as vertical metal-oxide-semiconductor field-effect transistors (MOSFETs), can replace the conventional planar transistors as the pass transistors of memory cells 110 to reduce the area occupied by the pass transistors, the coupling capacitance, as well as the interconnect routing complexity, as described below in detail.

Figure 2:
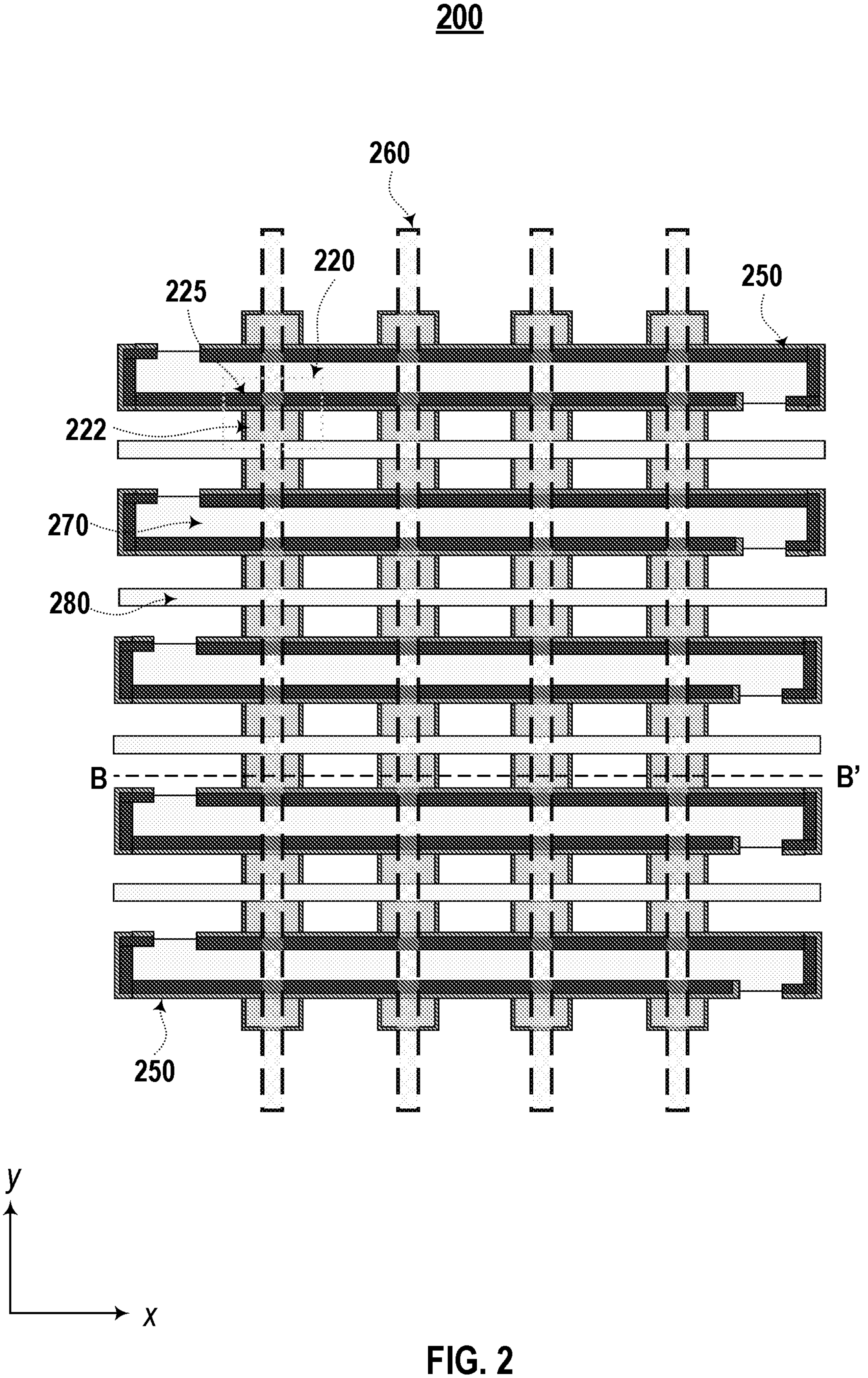
FIG. 2 illustrates a schematic plan view of an array of memory cells each including a vertical transistor in a memory device, according to various implementations of the present disclosure.
Figure 3A:
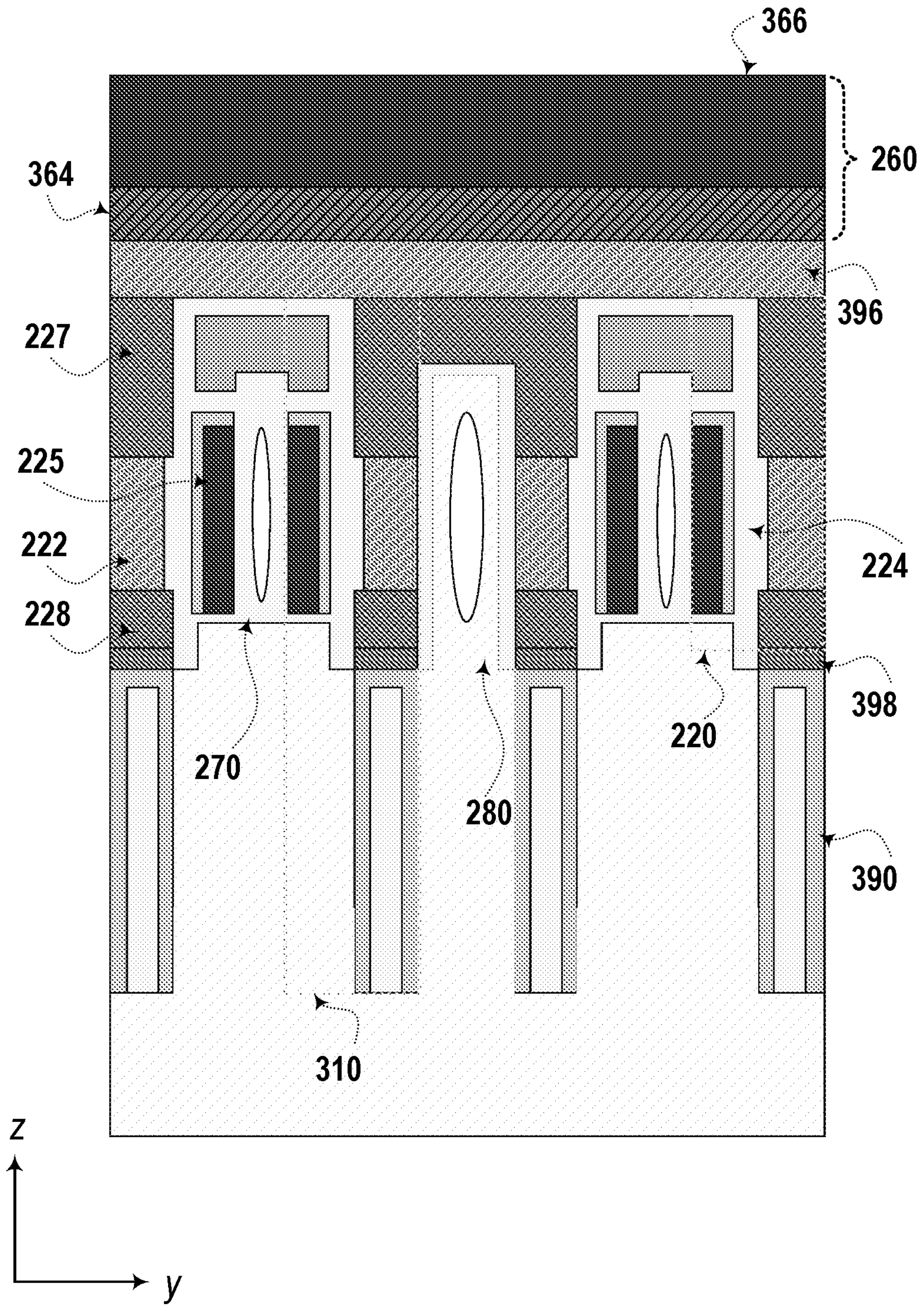
FIGS. 3A-3B each illustrates a schematic side view of a cross-section of memory cells in a 3D memory device, according to some implementations of the present disclosure.
Figure 3B:
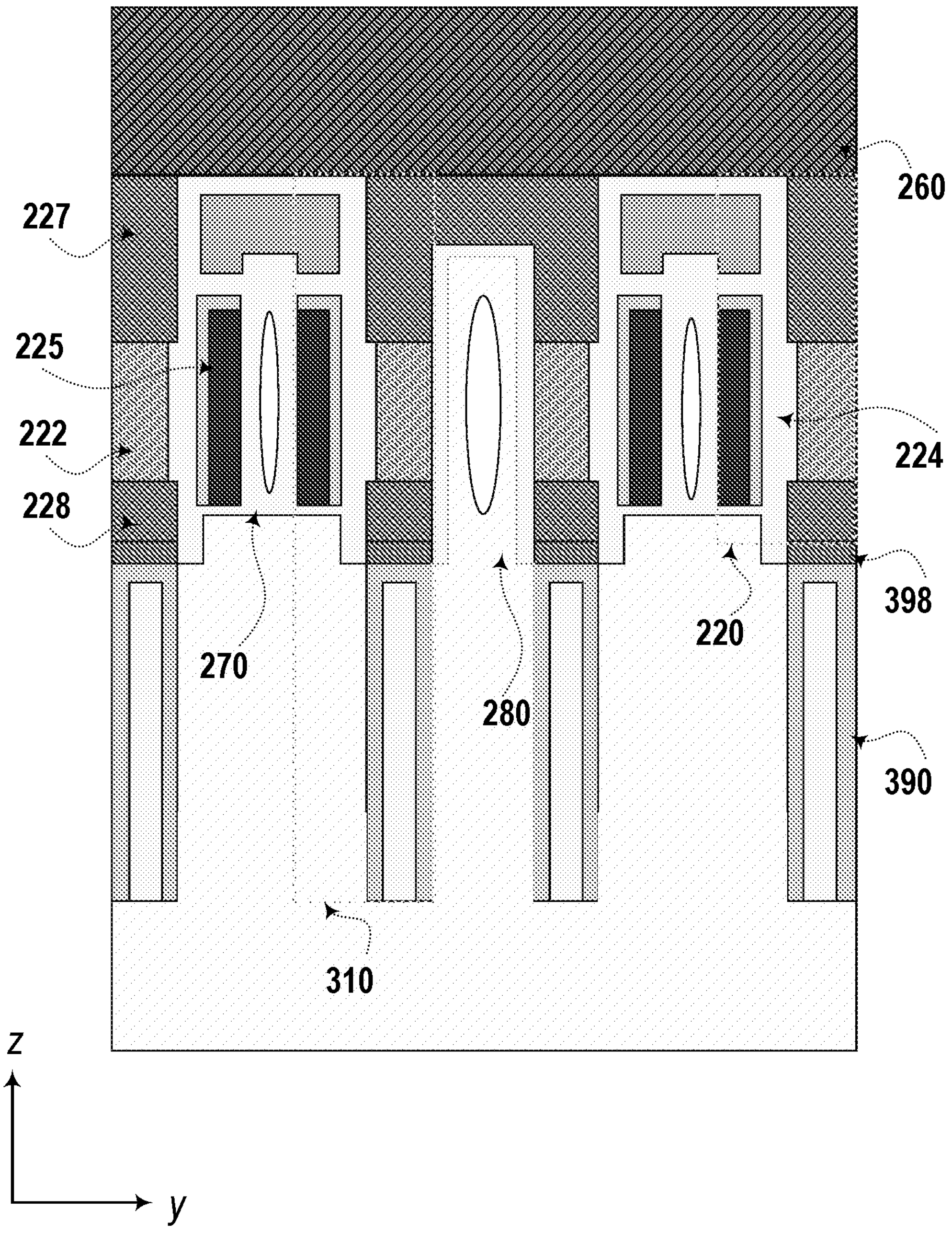

FIG. 2 illustrates a schematic plan view of an array of memory cells each including a vertical transistor in a memory device, according to various implementations of the present disclosure. FIGS. 3A and 3B each illustrates a schematic side view of a cross-section of memory cells in 3D memory devices, according to some implementations of the present disclosure. It is noted that FIGS. 3A and 3B each illustrates a cross-sectional side view of a column of memory cells along one bit line 260 in the y-z plane.

As shown in FIG. 2, memory device 200 can include a plurality of word lines 250 each extending in a first lateral direction (the x-direction, referred to as the word line direction). Memory device 200 can also include a plurality of bit lines 260 each extending in a second lateral direction perpendicular to the first lateral direction (the y-direction, referred to as the bit line direction). It is understood that FIG. 2 does not illustrate cross-section views of memory device 200 in the same lateral plane, and word lines 250 and bit lines 260 may be formed in different lateral planes for ease of routing, as described below in detail.

As shown in FIGS. 3A-3B, in some implementations, each memory cell 310 includes a storage unit 390 and a vertical transistor 220 having a semiconductor body 222 and a gate structure 225. Each row of vertical transistors 220 is aligned along the first lateral direction (i.e., x-direction), and the gate structures 225 of each row of vertical transistors 220 are connected with each other to form a word line 250 extending along the first lateral direction. In some implementations, the bit lines 260 extend in parallel along the second lateral direction (i.e., y-direction) and are connected with a column of vertical transistors 220.

As shown in FIGS. 3A and 3B, semiconductor body 222 can extend in the vertical direction (i.e., z-direction) perpendicular to the first and second lateral directions. Different from planar transistors in which the active regions are formed in the substrates, vertical transistor 220 includes a semiconductor body 222 extending vertically (in the z-direction). It is understood that semiconductor body 222 may have any suitable 3D shape, such as polyhedron shapes or a cylinder shape. That is, the cross-section of semiconductor body 222 in the plan view (e.g., in the x-y plane) can have a square shape, a rectangular shape (or a trapezoidal shape), a circular shape, a partial circular shape, an oval shape, a partial oval shape, or any other suitable shapes.

In some implementations as shown in FIG. 2, semiconductor bodies 222 between adjacent vertical transistors 220 along the second lateral direction (y-direction) can be laterally separated by first spacers 270 or second spacers 280. The plurality of first spacers 270 and second spacers 280 extend in parallel along the first lateral direction, and are alternatively arranged along the second lateral direction.

In some implementations as shown in FIG. 2 and in FIGS. 3A and 3B, each vertical transistor 220 includes a gate structure 225 located at one side of the semiconductor body 222. The gate structure 225 of adjacent vertical transistors 220 in the first lateral direction (i.e., the word line direction or the x-direction) are continuous, e.g., parts of a continuous conductive layer having the gate structures 225. That is, multiple gate structures 225 of a row (e.g., 211-214) of vertical transistors 220 can be connected with each other and extending along the first lateral direction to form a word line 250 of the row of vertical transistors 220.

The two word lines 250 of two adjacent rows of vertical transistors 220 can be embedded in a same first spacer 270 separating the two adjacent rows of vertical transistors 220, as shown in FIG. 2. Gate structures 225 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate structure 225 may include doped polysilicon, i.e., a gate poly. In some implementations, gate structure 225 includes multiple conductive layers, such as a W layer over a TiN layer. In some implementations, a gate dielectric 224 is laterally between gate structure 225 and the semiconductor body 222. Gate dielectric 224 can include any suitable dielectric materials, such as silicon oxide, silicon nitride, silicon oxynitride, or high-k dielectrics. For example, gate dielectric 224 may include silicon oxide, i.e., gate oxide.

In some implementations, the plurality of first spacers 270 and second spacers 280 can include any suitable dielectric material, such as silicon oxide. In some implementations, each of the plurality of first spacers 270 and second spacers 280 can further include one or more air gaps embedded in the dielectric material. As described below with respect to the fabrication process, the air gaps may be formed due to the relatively small pitches of word lines 250 (and rows of vertical transistors 220) along the second lateral direction. On the other hand, the relatively large dielectric constant of air in air gaps (e.g., about four times the dielectric constant of silicon oxide) can improve the insulation effect between word lines 250 (and rows of vertical transistors 220) compared with some dielectrics (e.g., silicon oxide).

As shown in FIGS. 3A and 3B, each vertical transistor 220 can include a pair of a source and a drain 227, 228 (S/D, dope regions, a.k.a., source electrode and drain electrode) formed at the two ends of semiconductor body 222 in the vertical direction (the z-direction), respectively. The source and drain 227, 228 can be lightly doped with any suitable P-type dopants, such as boron (B) or Gallium (Ga), or any suitable N-type dopants, such as phosphorus (P) or arsenic (As). In each vertical transistor 220, the source and drain 227, 228 can be separated at two ends of the semiconductor body 222 in the vertical direction (the z-direction). Gate structure 225 is formed vertically, corresponding to the portion of the semiconductor body 222 between the source and drain 227, 228. As a result, the channel of the vertical transistor 220 can be formed in semiconductor body 222 vertically between the source and drain 227, 228 when a gate voltage applied to the gate structure 225 is above the threshold voltage of the vertical transistor 220.

It is also noted that memory device 200 include single-gate transistors as shown in FIGS. 2 and 3A-3B. That is, gate structure 225 may be in contact with a single side of semiconductor body 222. In some other implementations not shown, the disclosed memory device can include multi-gate vertical transistors, such as double-gate vertical transistors (i.e., dual-side gate vertical transistors), tri-gate vertical transistors (i.e., tri-side gate vertical transistors), and all-around-gate (GAA) vertical transistors.

As shown in FIGS. 3A and 3B, a pair of vertical transistors 220 can have separated sources/drains 228 connected to a storage unit 390 (e.g., a capacitor) through a storage unit contact 398, and can also have a common source/drain 227 connected to a bit line 260 through a bit line contact 396. The bit line contact 396 can be heavily doped semiconductor material with any suitable P-type dopants, such as boron (B) or Gallium (Ga), or any suitable N-type dopants, such as phosphorus (P) or arsenic (As). In some implementations, as shown in FIG. 3A, each bit line 260 can include a silicide line 364 and a metal line 366. The silicide line 364 can include any suitable metal silicide material and be in direct contact with the bit line contact 396. The metal line 366 can include any suitable metal material, such as tungsten (W), copper (Cu), aluminum (Al), etc. In some other implementations as shown in FIG. 3B, each bit line 260 can include a single silicide line in direct contact with the common source/drain 227. That is, the bit line contact 396 and the metal line 366 can be omitted. In such implementations, the thickness of the silicide line can be in a range between about 10 nm and about 30 nm, such as about 20 nm.

In some implementations, the storage unit 390 can include any devices that are capable of storing binary data (e.g., 0 and 1), including but not limited to, capacitors for DRAM cells and FRAM cells, and PCM elements for PCM cells. In some implementations, each vertical transistor 220 controls the selection and/or the state switch of the respective storage unit 390 coupled to vertical transistor 220.

In some implementations, the storage unit 390 is a capacitor including a first electrode (not shown) coupled with the source/drain 228 of vertical transistor 220. The capacitor can also include a capacitor dielectric (not shown) in contact with the first electrode, and a second electrode (not shown) in contact with the capacitor dielectric. That is, the capacitor can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground. In some implementations, the capacitor dielectric includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, the two electrodes can include conductive materials including, but not limited to, W, Co, Cu, Al, TiN, TaN, polysilicon, silicides, or any combination thereof.

It is understood that the capacitor may include any suitable structure and configuration, such as a planar capacitor, a stack capacitor, a multi-fins capacitor, a cylinder capacitor, a trench capacitor, or a substrate-plate capacitor. That is, capacitor 390 can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground.

In some implementations, one or more peripheral circuits (not shown) can be coupled to the memory cell array shown in 200 through bit lines 260, word lines 250, and any other suitable metal wirings. It is noted that the one or more peripheral circuits can include any suitable circuits for facilitating the operations of memory cell array by applying and sensing voltage signals and/or current signals through word lines 250 and bit lines 260 to and from each memory cell 310. The one or more peripheral circuits can include various types of peripheral circuits formed using CMOS technologies.

Figure 4:
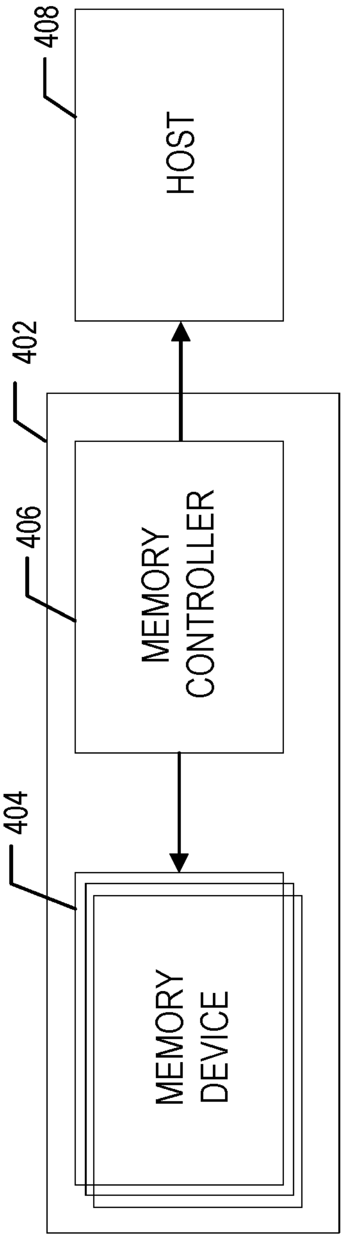
FIG. 4 illustrates a block diagram of a system having a memory device, according to some implementations of the present disclosure.
Figure 5:
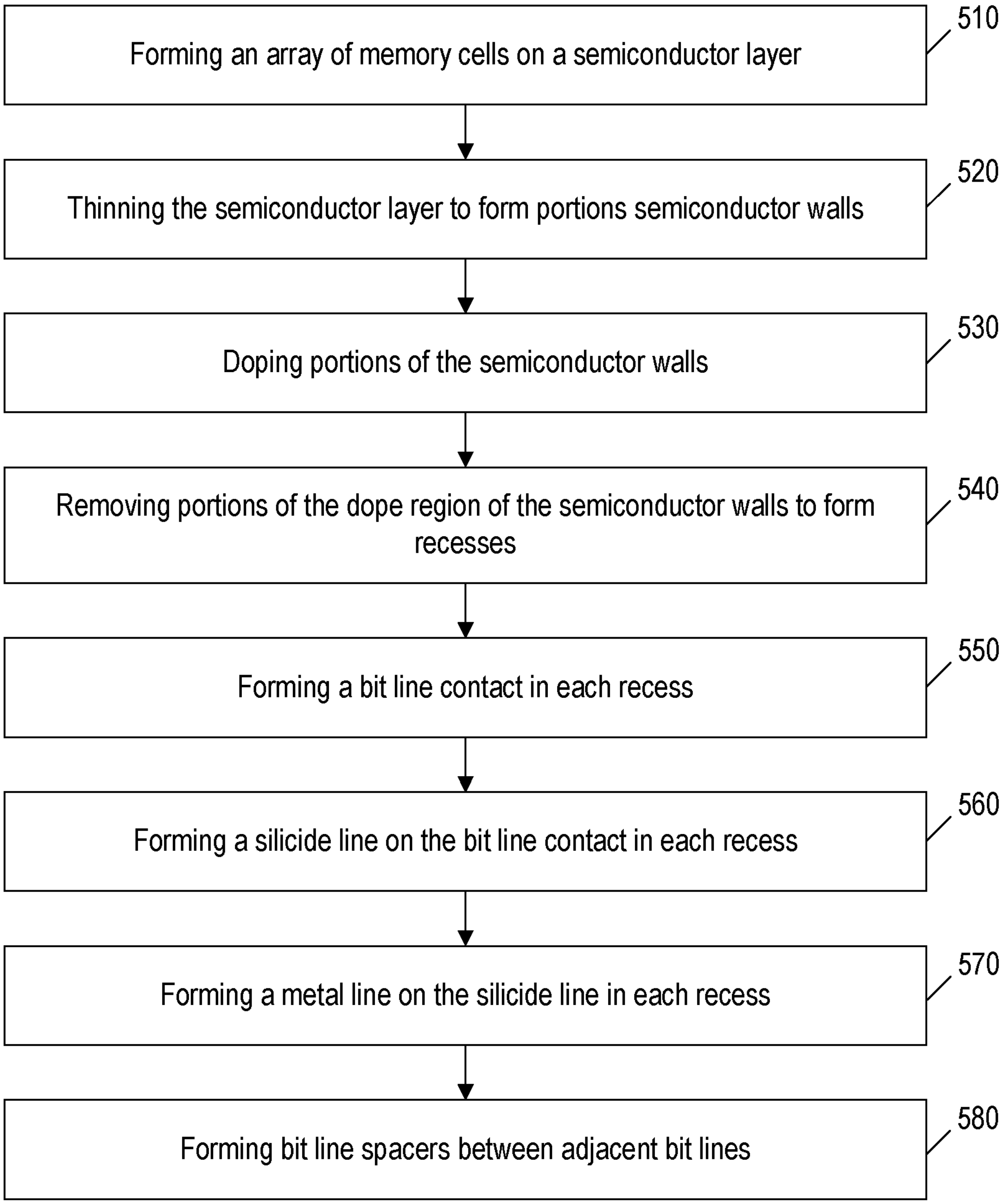
FIG. 5 illustrates a flowchart of a fabricating method for forming a 3D memory device, according to some implementations of the present disclosure.

FIG. 4 illustrates a block diagram of a system 400 having a memory device, according to some implementations of the present disclosure. System 400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 5, system 400 can include a host 408 and a memory system 402 having one or more memory devices 404 and a memory controller 406. Host 408 can be a processor of an electronic device, such as a central processing unit (CPU), or a system-on-chip (SoC), such as an application processor (AP). Host 408 can be configured to send or receive the data to or from memory devices 404. Memory device 404 can be any memory devices disclosed herein, such as memory device 100. In some implementations, memory device 404 includes an array of memory cells shown in 200/300A/300B/400A each including a vertical transistor, as described above in detail.

Memory controller 406 is coupled to memory device 404 and host 408 and is configured to control memory device 404, according to some implementations. Memory controller 406 can manage the data stored in memory device 404 and communicate with host 408. Memory controller 406 can be configured to control operations of memory device 404, such as read, write, and refresh operations. Memory controller 406 can also be configured to manage various functions with respect to the data stored or to be stored in memory device 404 including, but not limited to refresh and timing control, command/request translation, buffer and schedule, and power management. In some implementations, memory controller 406 is further configured to determine the maximum memory capacity that the computer system can use, the number of memory banks, memory type and speed, memory particle data depth and data width, and other important parameters. Any other suitable functions may be performed by memory controller 406 as well. Memory controller 406 can communicate with an external device (e.g., host 408) according to a particular communication protocol. For example, memory controller 406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

FIG. 5 illustrates a flowchart of a fabricating method 500 for forming a 3D memory device including vertical transistors, such as memory device 300A described above in connection with FIG. 3A, according to some implementations of the present disclosure. FIGS. 6A-8B, 7A-7B, 8A-8B, 9A-9B, 10A-10B, 11A-11B, 12A-12B, 13A-13B,

14A-14B, 15A-15B, and 16A-16B illustrate schematic side cross-sectional views of a 3D memory device at certain fabricating stages of the method 500 shown in FIG. 5, according to various implementations of the present disclosure. It is understood that the operations shown in method 500 are not exhaustive and that other operations can be performed as well before, after, or between any of the illustrated operations. Further, some of the operations may be performed simultaneously, or in a different order than shown in FIG. 5.

Figure 6A:
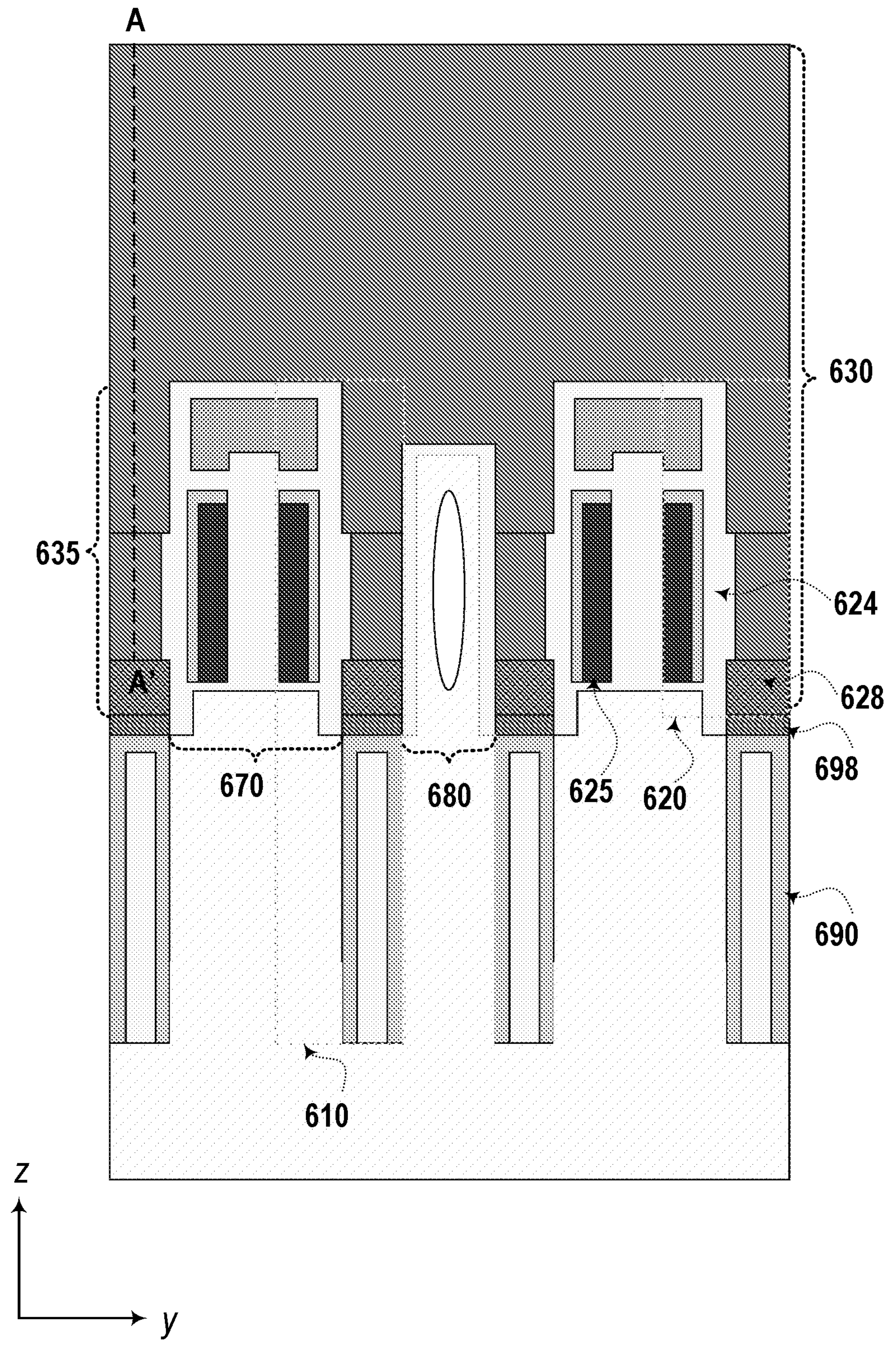
FIGS. 6A-6B each illustrates a schematic side cross-sectional view of a 3D memory device at a certain fabricating stage of the method shown in FIG. 5, according to various implementations of the present disclosure.
Figure 6B:
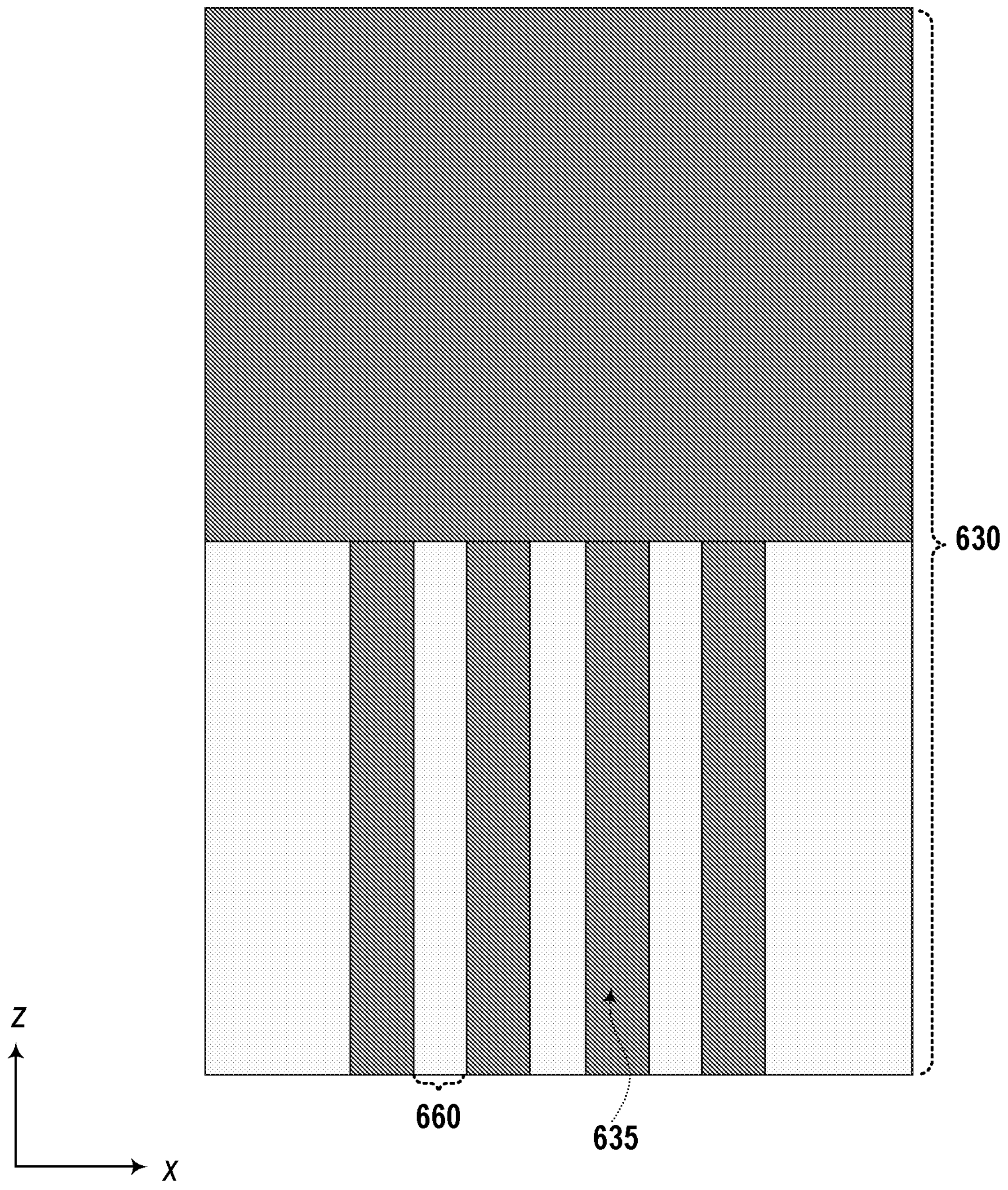

As shown in FIG. 5, method 500 can start at operation 510, in which an array of memory cells can be formed on a semiconductor layer. FIG. 6A illustrates a schematic side cross-sectional view of the array of memory cells along a bit line in y-z plane after operation 510 of method 500. FIG. 6B illustrates a schematic side cross-sectional view of the 3D structure in x-z plane along AA' line shown in FIG. 6A. It is noted that some components shown in FIG. 6A are not shown in FIG. 6B.

In some implementations as shown in FIG. 6A, the array of memory cells 610 can include an array of vertical transistors 620 and an array of capacitors 690. Each vertical transistor 620 can include a semiconductor pillar 635 extending vertically (in the z-direction) and have any suitable 3D shape, such as polyhedron shapes or a cylinder shape. That is, the cross-section of each semiconductor pillar 635 in the plan view (e.g., in the x-y plane) can have a square shape, a rectangular shape (or a trapezoidal shape), a circular shape, an oval shape, or any other suitable shapes.

In some implementations, forming the array of semiconductor pillars 635 can include forming a plurality of parallel first spacers 670 and second spacers 680 extending along the first lateral direction (x-direction), as shown in FIG. 6A, and a plurality of parallel third spacers 660 extending along the second lateral direction (y-direction), as shown in FIG. 6B. In some implementations, a lithography process is performed to pattern a plurality of first, second, and third trenches using an etch mask (e.g., a photoresist mask and/or a hard mask), and one or more dry etching and/or wet etching processes, such as RIE, are performed to etch the plurality of first, second, and third trenches in a portion of a semiconductor layer 630. Then the first spacers 670, second spacers 680, and third spacers 660 can be formed by depositing a dielectric material, such as silicon oxide, to fill the third trenches, using a thin film deposition process including, but not limited to, CVD, PVD, ALD, or any combination thereof. The remaining portions of the semiconductor layer 630 form the plurality of semiconductor pillars 635.

As shown in FIG. 6A, forming the array of memory cells 610 can further include forming two conductive structures 625 embedded in each first spacer 670. In some implementations, each conductive structure 625 can be isolated from an adjacent row of semiconductor pillars 635 by a gate dielectric layer 624. The conductive structure 625 can be used as the gate structure of each vertical transistor 620. The conductive structures 625 of a row of vertical transistors 620 extending along the first lateral direction can be connected with each other to form a word line. As shown in FIG. 6A, forming the array of memory cells 610 can further include doping an end of each semiconductor pillar 635 by ion implantation and/or thermal diffusion to form a doped region 628 as a source/drain of the vertical transistor 620. As shown in FIG. 6A, forming the array of memory cells 610 can further include forming the plurality of capacitors 690 each being electrically coupled with the doped region 628 of each semiconductor pillar 635 via contact 698.

Figure 7A:
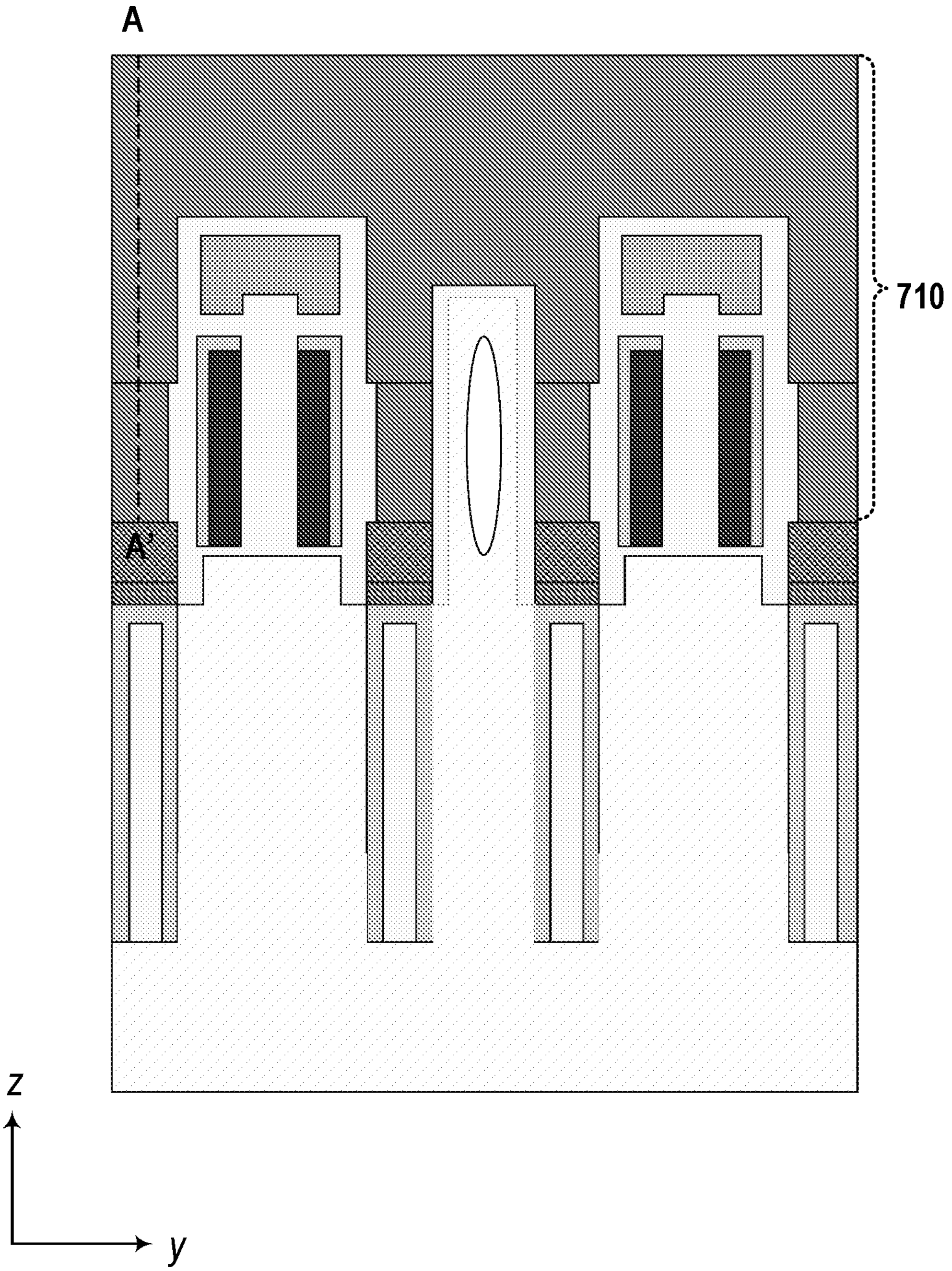
FIGS. 7A-7B each illustrates a schematic side cross-sectional view of a 3D memory device at a certain fabricating stage of the method shown in FIG. 5, according to various implementations of the present disclosure.
Figure 7B:
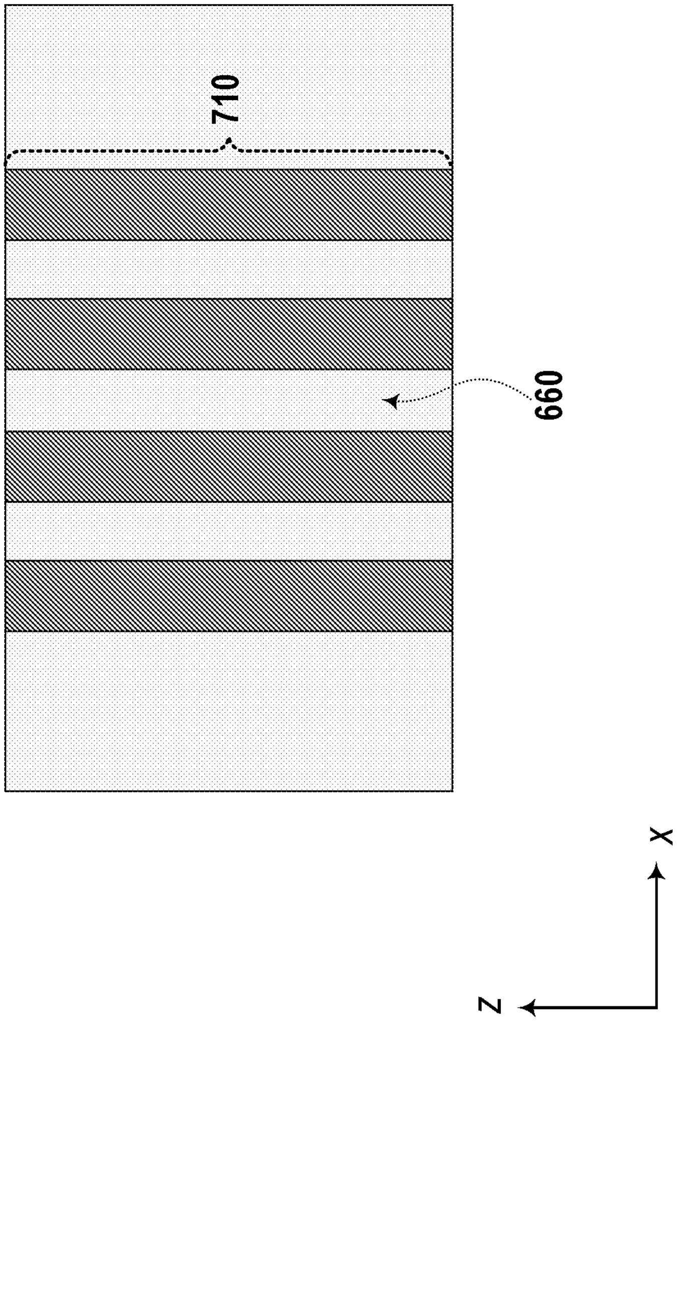

As shown in FIG. 5, method 500 can proceed to operation 520, in which the semiconductor layer can be thinned. FIG. 7A illustrates a schematic side cross-sectional view of the array of memory cells along y-z plane after operation 520 of method 500. FIG. 7B illustrates a schematic side cross-sectional view of the 3D structure in x-z plane along AA' line shown in FIG. 7A. As shown in FIGS. 7A and 7B, semiconductor layer 630 can be thinned from the back side (top side in FIGS. 7A and 7B) by any suitable process, such as a chemical mechanical polishing (CMP) process. As such, along the second lateral direction (y-direction), as shown in FIG. 7B, the remaining undoped portion of the semiconductor layer 630 is separated into a plurality of semiconductor walls 710. It is noted that some components shown in FIG. 7A are not shown in FIG. 7B.

Figure 8A:
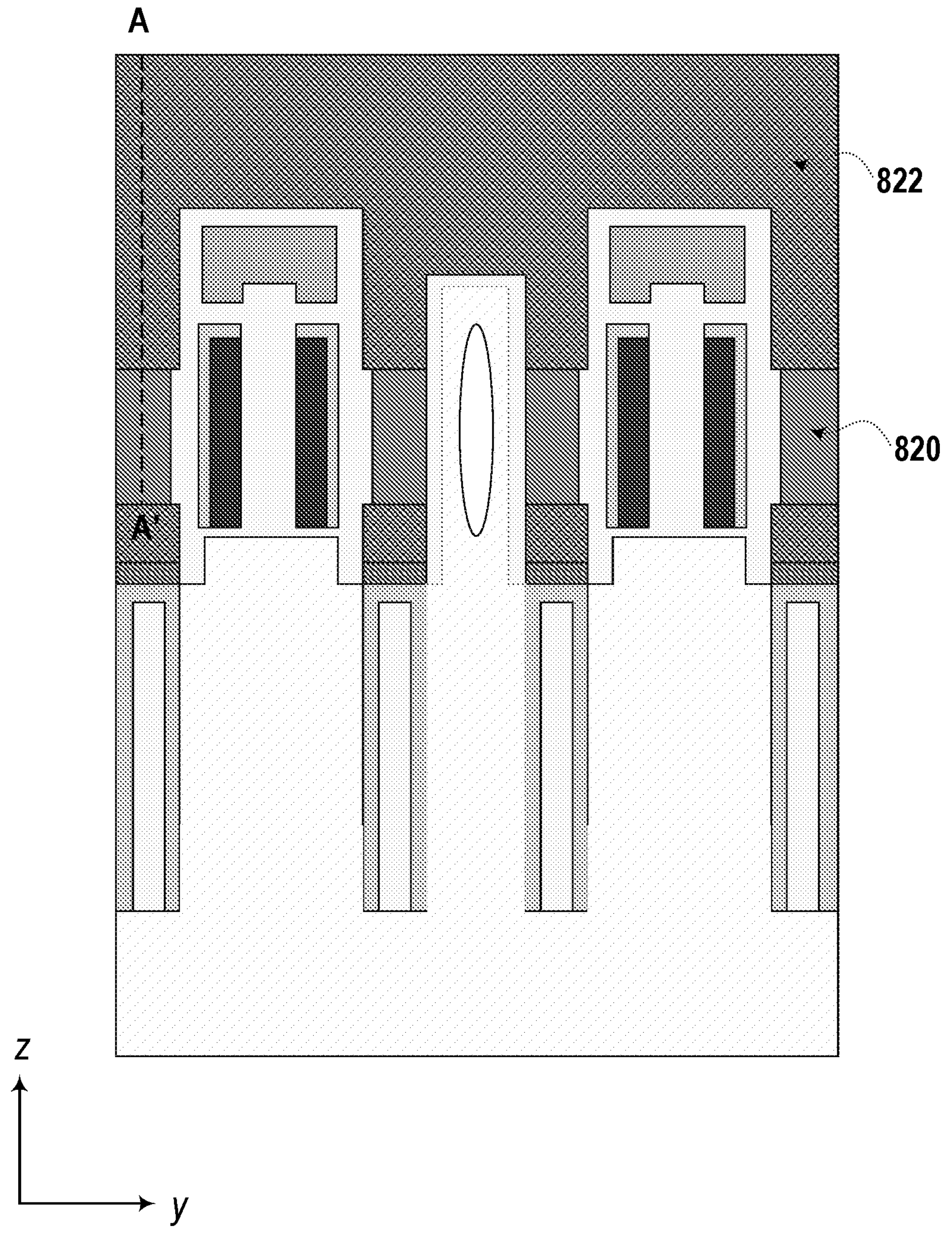
FIGS. 8A-8B each illustrates a schematic side cross-sectional view of a 3D memory device at a certain fabricating stage of the method shown in FIG. 5, according to various implementations of the present disclosure.
Figure 8B:
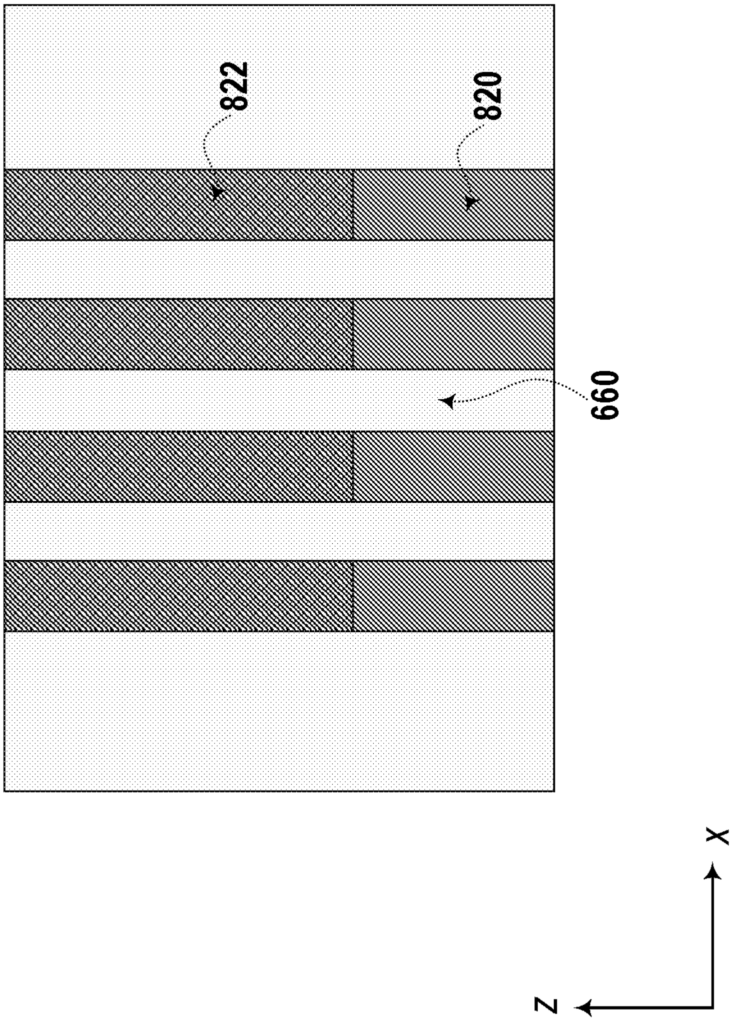

As shown in FIG. 5, method 500 can proceed to operation 530, in which the portions of the semiconductor walls can be doped. FIG. 8A illustrates a schematic side cross-sectional view of the array of memory cells along y-z plane after operation 530 of method 500. FIG. 8B illustrates a schematic side cross-sectional view of the 3D structure in x-z plane along AA' line shown in FIG. 8A. As shown in FIGS. 8A and 8B, portions of the semiconductor walls 710 can be doped by ion implantation and/or thermal diffusion to form a doped region 822. Doped region 822 can be used as the source/drain of the vertical transistors 620. The remaining undoped region 820 in semiconductor pillars 635 can be used as the channel of the vertical transistors 620. It is noted that some components shown in FIG. 8A are not shown in FIG. 8B.

Figure 9A:
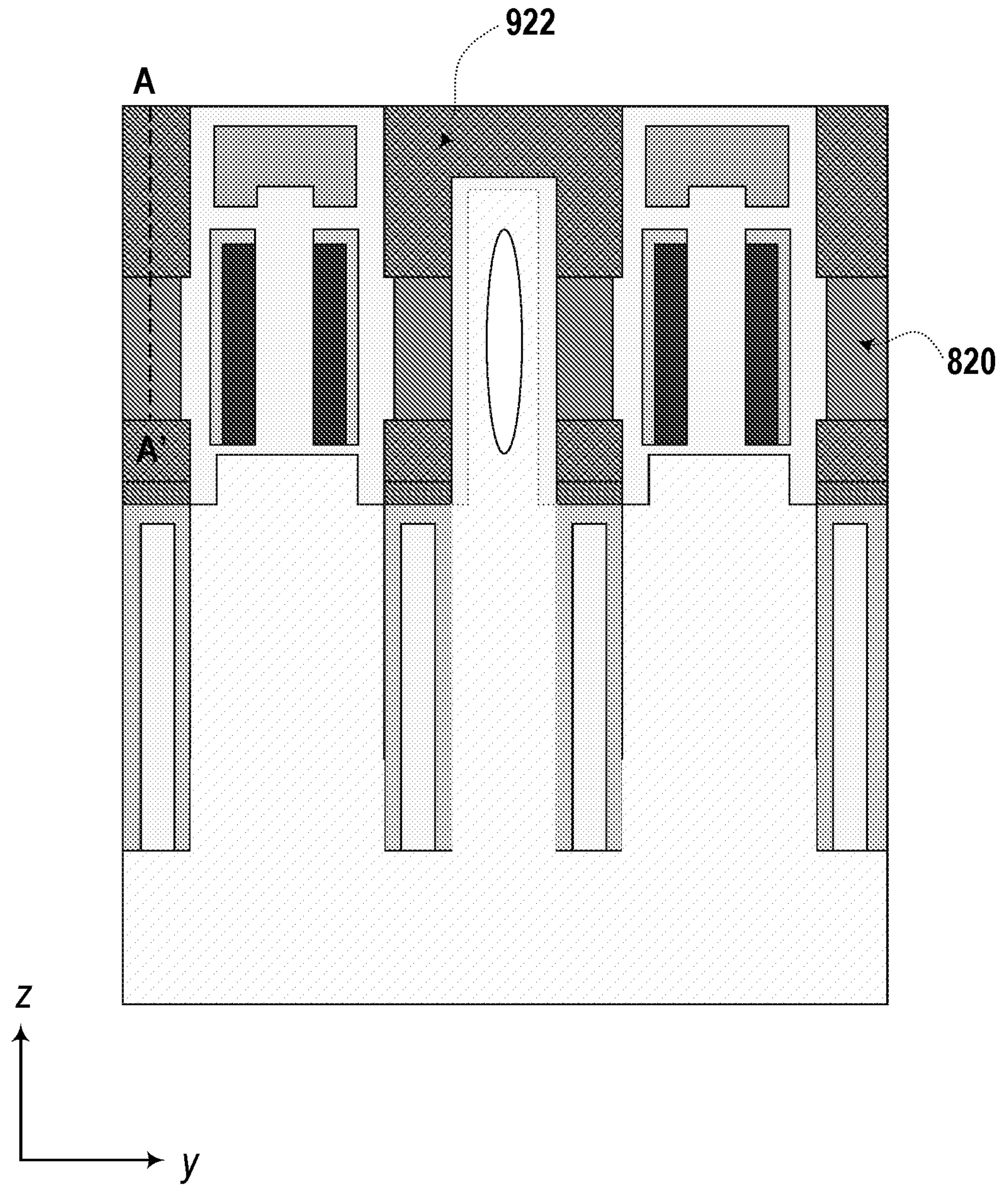
FIGS. 9A-9B each illustrates a schematic side cross-sectional view of a 3D memory device at a certain fabricating stage of the method shown in FIG. 5, according to various implementations of the present disclosure.
Figure 9B:
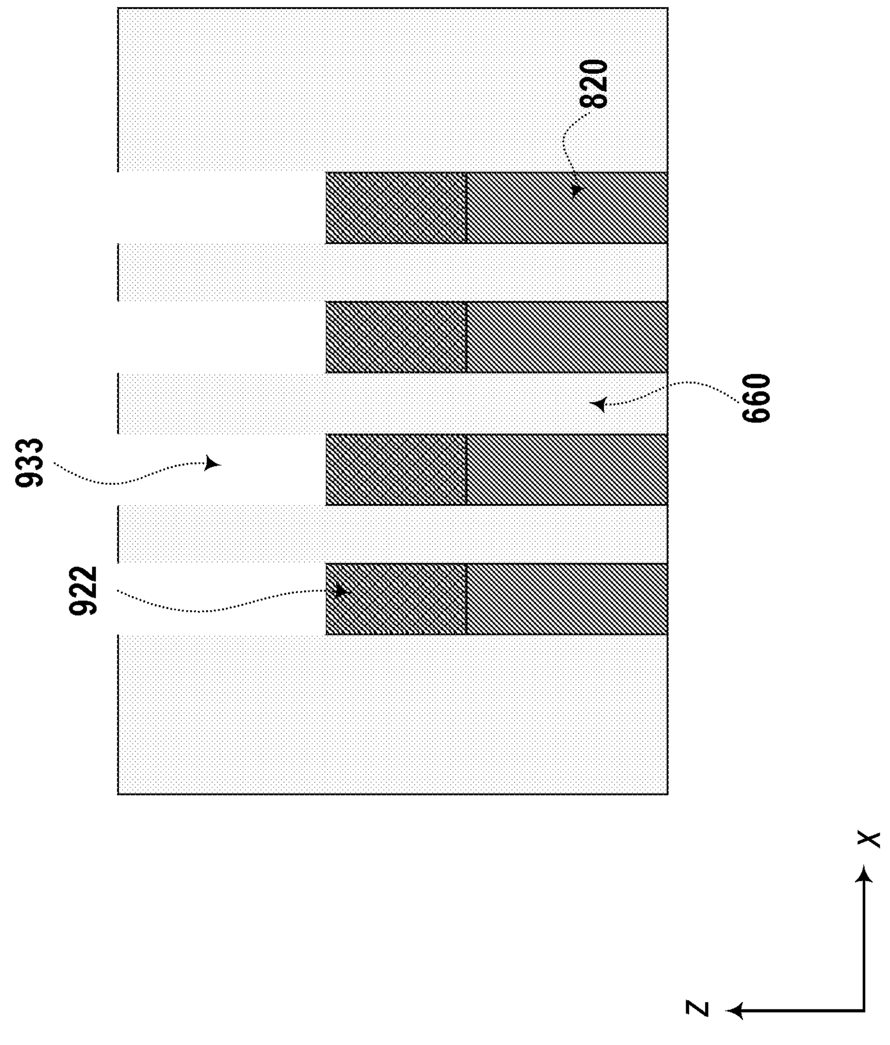

As shown in FIG. 5, method 500 can proceed to operation 540, in which portions of the dope region of the semiconductor walls can be removed to form common sources/drains. FIG. 9A illustrates a schematic side cross-sectional view of the array of memory cells along y-z plane after operation 540 of method 500. FIG. 9B illustrates a schematic side cross-sectional view of the 3D structure in x-z plane along AA' line shown in FIG. 9A. As shown in FIGS. 9A and 9B, portions of the dope region 822 can be removed by etching to form a common source/drain 922. A recess 933 can be formed between adjacent third spacers 660, as shown in FIG. 9B. It is noted that some components shown in FIG. 9A are not shown in FIG. 9B.

Figure 10A:
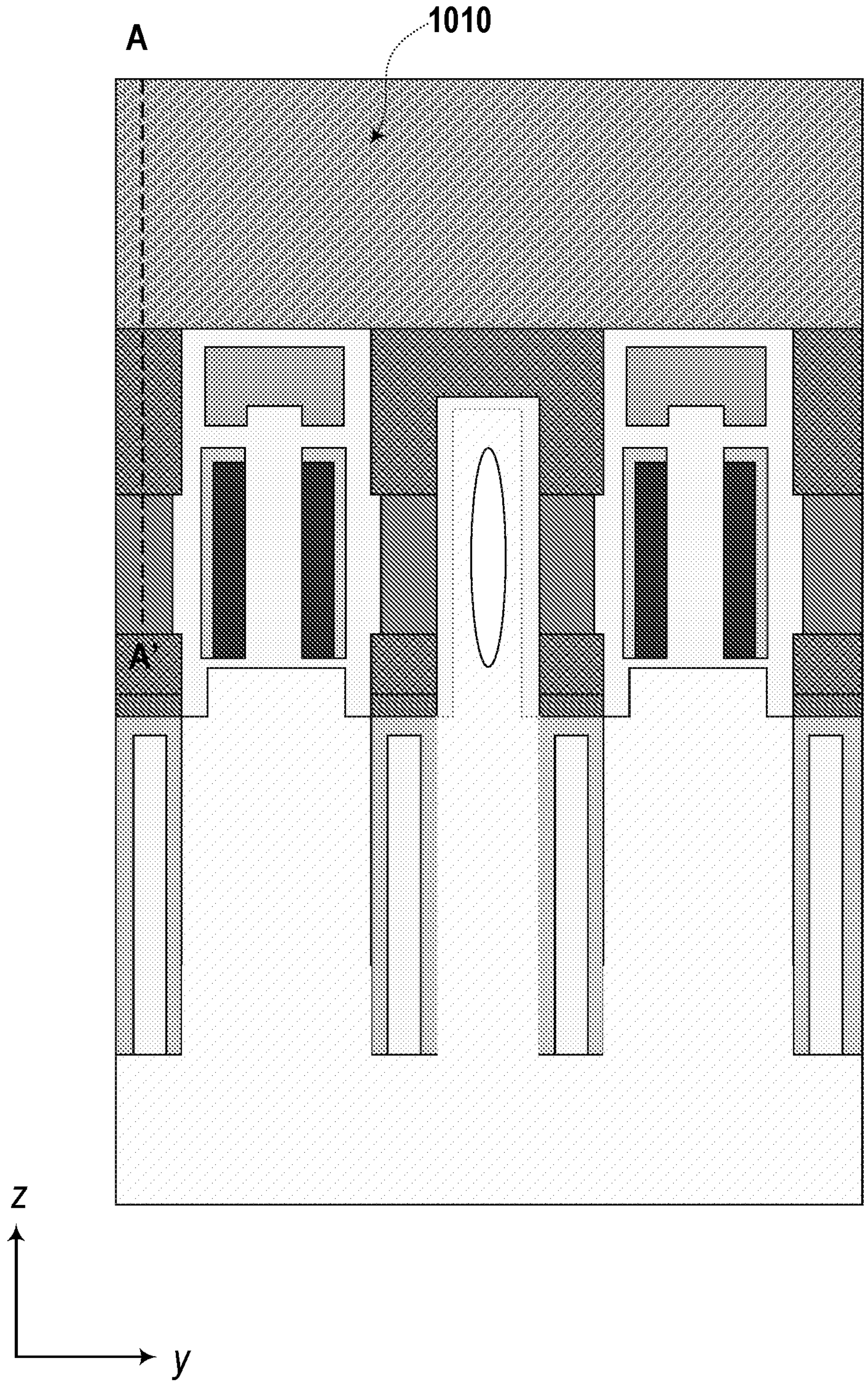
FIGS. 10A-10B each illustrates a schematic side cross-sectional view of a 3D memory device at a certain fabricating stage of the method shown in FIG. 5, according to various implementations of the present disclosure.
Figure 10B:
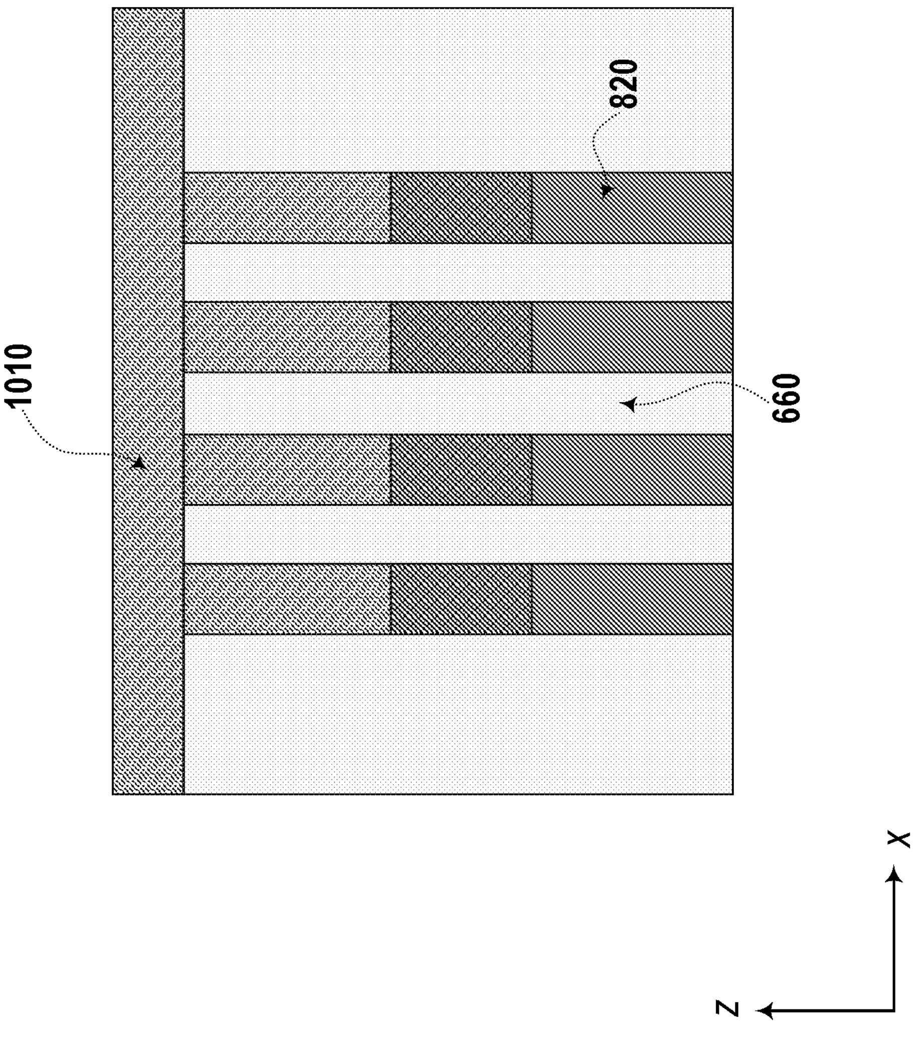
Figure 11A:
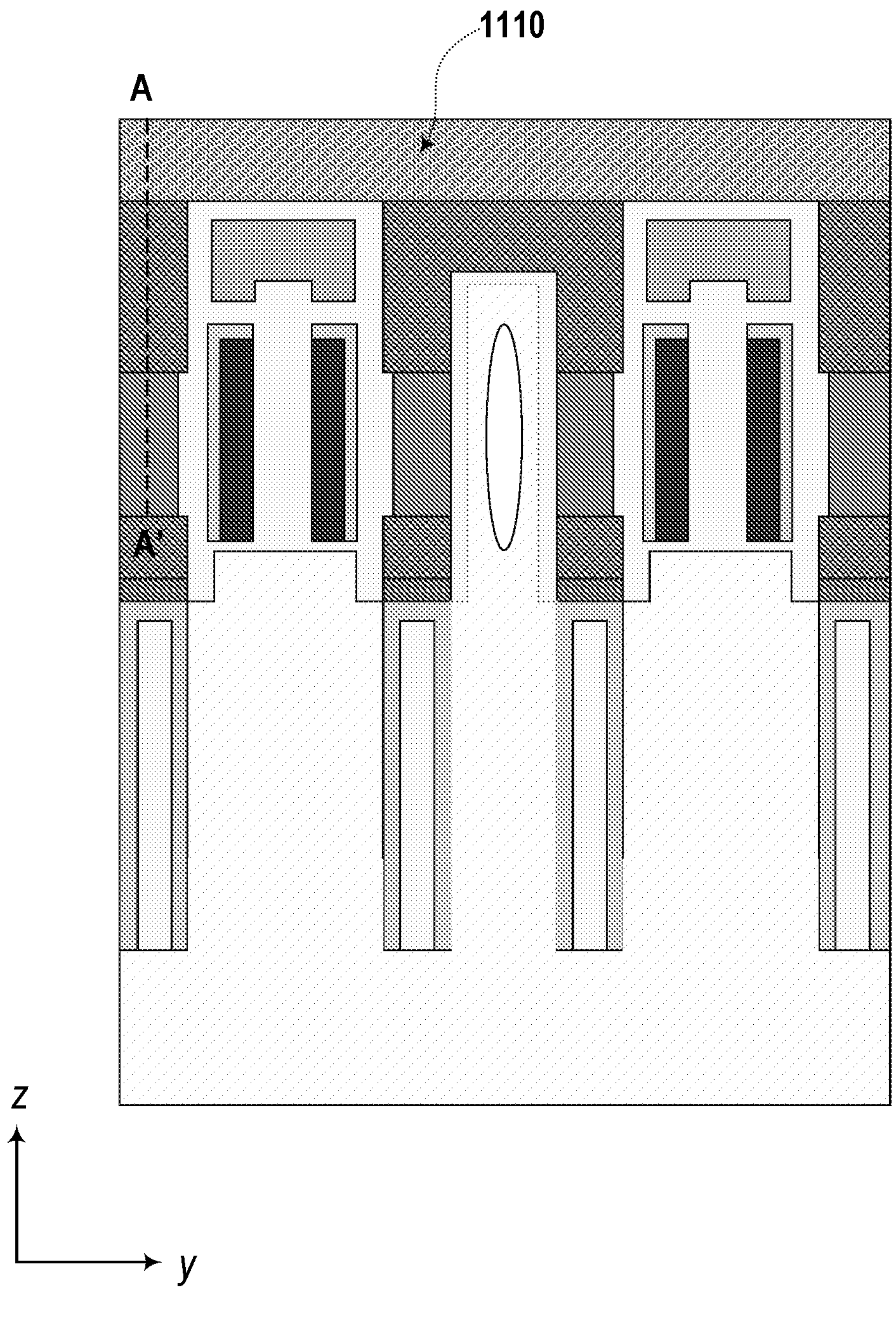
FIGS. 11A-11B each illustrates a schematic side cross-sectional view of a 3D memory device at a certain fabricating stage of the method shown in FIG. 5, according to various implementations of the present disclosure.
Figure 11B:
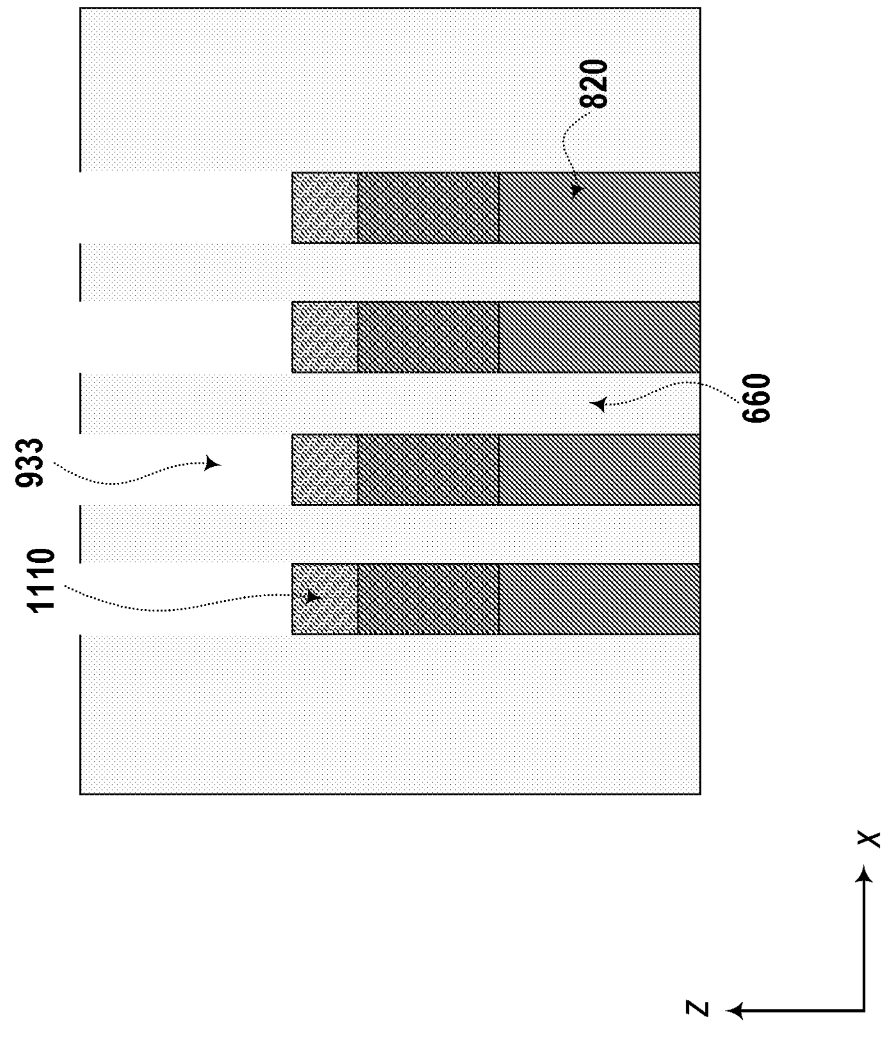

As shown in FIG. 5, method 500 can proceed to operation 550, in which a bit line contact can be formed in each recess. FIG. 11A illustrates a schematic side cross-sectional view of the array of memory cells along y-z plane after operation 540 of method 500. FIG. 11B illustrates a schematic side cross-sectional view of the 3D structure in x-z plane along AA' line shown in FIG. 11A. In some implementations, forming the bit line contacts can include forming a heavily doped layer 1010 (e.g., doped TiN as a glue layer) in the recesses, as shown in FIGS. 10A and 10B, and can include an etching back process to remove portions of the heavily doped layer 1010, such that the remaining portions of the heavily doped layer 1010 in the recesses 933 form the bit line contacts 1110, as shown in FIGS. 11A and 11B. It is noted that some components shown in FIGS. 10A and 11A are not shown in FIGS. 10B and 11B.

Figure 12A:
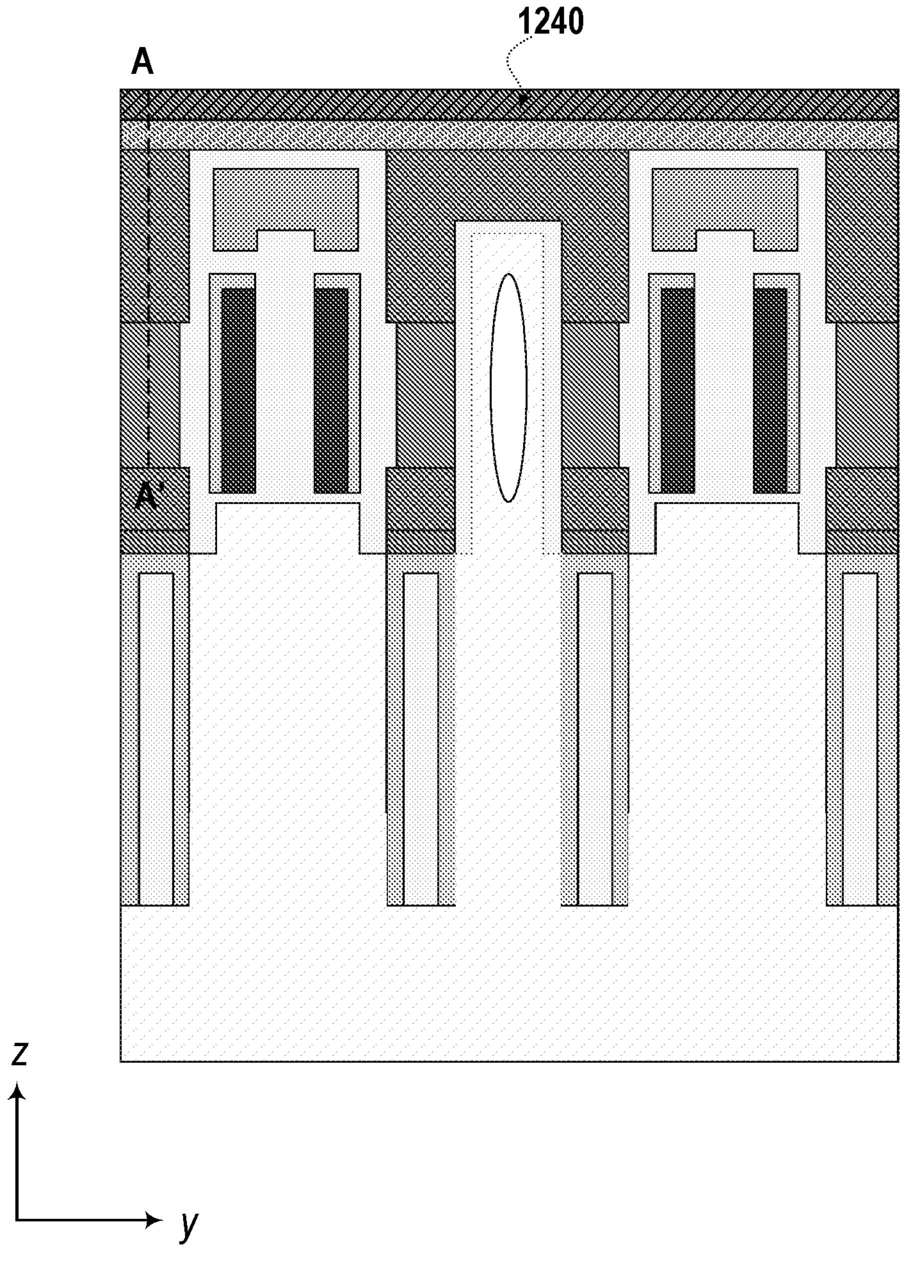
FIGS. 12A-12B each illustrates a schematic side cross-sectional view of a 3D memory device at a certain fabricating stage of the method shown in FIG. 5, according to various implementations of the present disclosure.
Figure 12B:
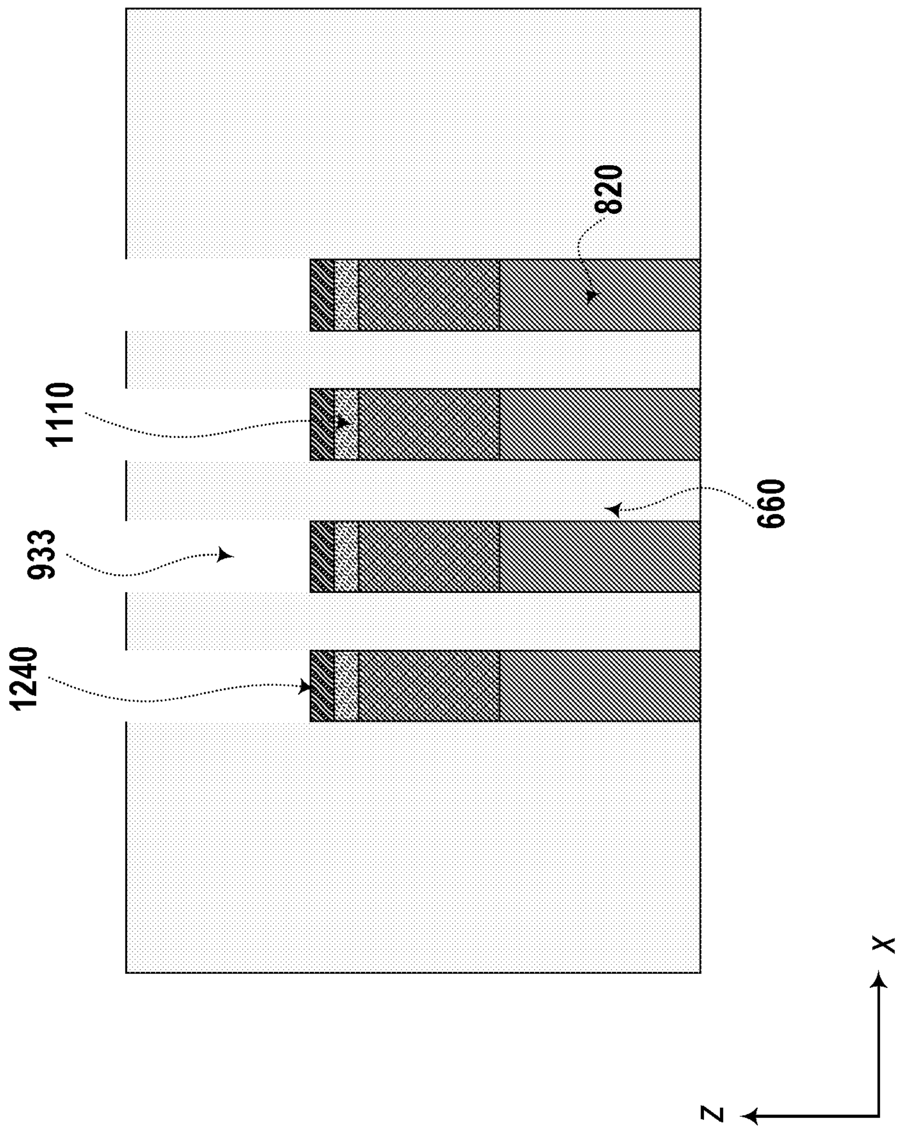

As shown in FIG. 5, method 500 can proceed to operation 560, in which a silicide line can be formed on the bit line contact in each recess. FIG. 12A illustrates a schematic side cross-sectional view of the array of memory cells along y-z plane after operation 560 of method 500. FIG. 12B illustrates a schematic side cross-sectional view of the 3D structure in x-z plane along AA' line shown in FIG. 12A. In some implementations, a metal silicide layer 1240 can be formed on the bit line contact 1110 in each recess 933. The metal silicide layer 1240 can be formed by depositing a silicon layer and a followed metal ion implantation and/or thermal diffusion to transform the silicon layer to the metal silicide layer 1240. In some implementations, the metal silicide layer 1240 can include NiSi. It is noted that some components shown in FIG. 12A are not shown in FIG. 12B.

Figure 13A:
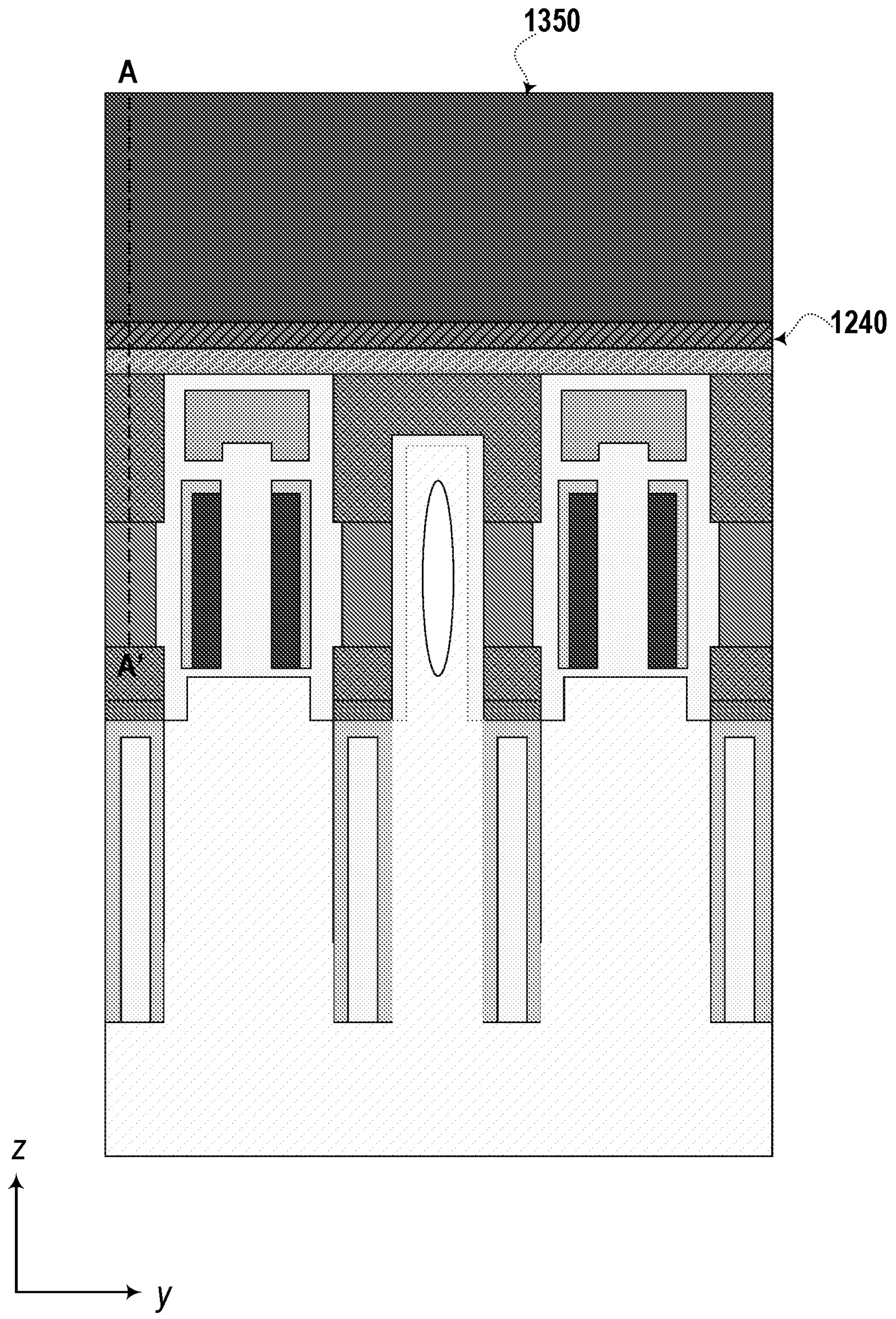
FIGS. 13A-13B each illustrates a schematic side cross-sectional view of a 3D memory device at a certain fabricating stage of the method shown in FIG. 5, according to various implementations of the present disclosure.
Figure 13B:
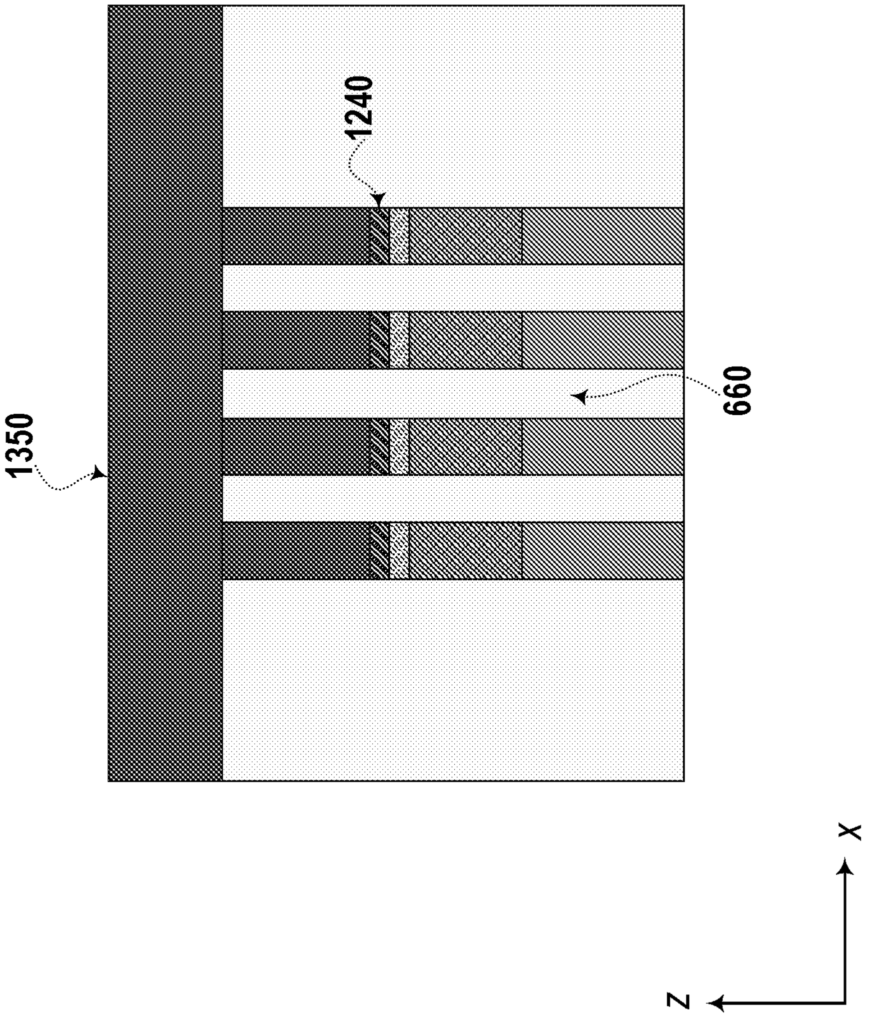
Figure 14A:
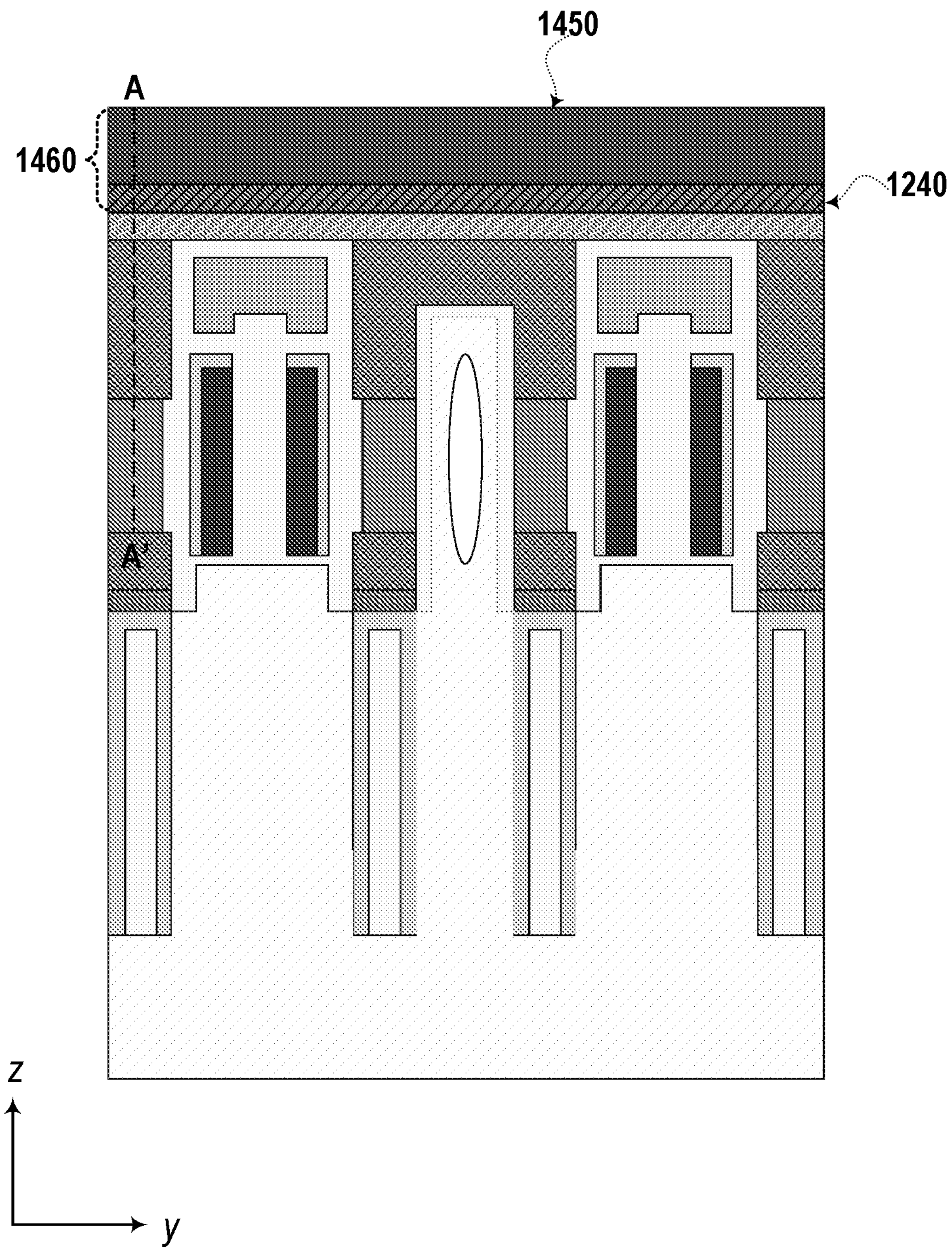
FIGS. 14A-14B each illustrates a schematic side cross-sectional view of a 3D memory device at a certain fabricating stage of the method shown in FIG. 5, according to various implementations of the present disclosure.
Figure 14B:
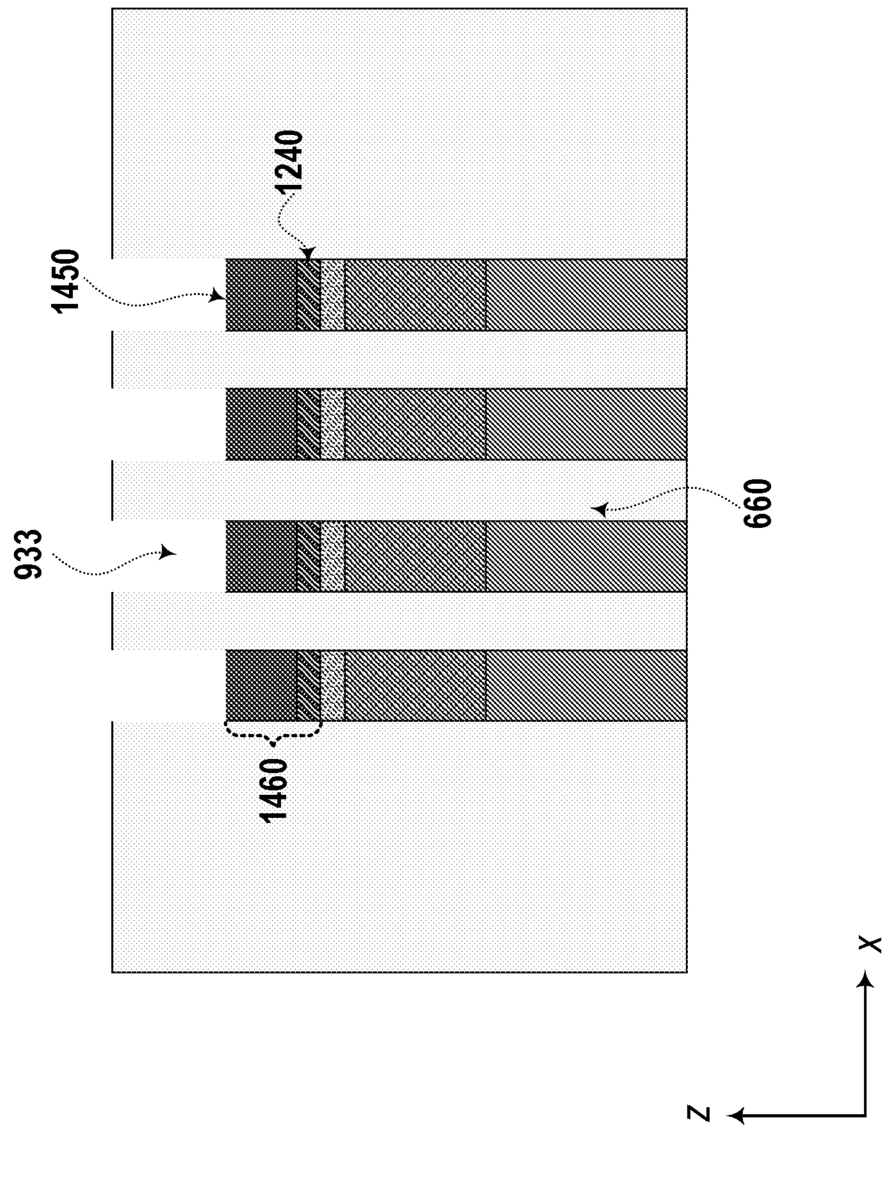

As shown in FIG. 5, method 500 can proceed to operation 570, in which a metal line can be formed on the silicide line in each recess. FIG. 14A illustrates a schematic side cross-sectional view of the array of memory cells along y-z plane after operation 570 of method 500. FIG. 14B illustrates a schematic side cross-sectional view of the 3D structure in x-z plane along AA' line shown in FIG. 14A. In some implementations, a metal layer 1350 can be formed on the silicide line in each recess 933, as shown in FIGS. 13A and 13B. The metal layer 1350 can include any suitable metal material, such as tungsten (W), copper (Cu), aluminum (Al), etc. An etch back process can be performed to remove portions of the metal layer 1350, such that the remaining portions of the metal layer 1350 form a metal line 1450 in each recess 933, as shown in FIGS. 14A and 13B. The metal line 1450 and the silicide line 1240 in each recess 933 can form a bit line 1460. It is noted that some components shown in FIGS. 13A and 14A are not shown in FIGS. 13B and 14B.

Figure 15A:
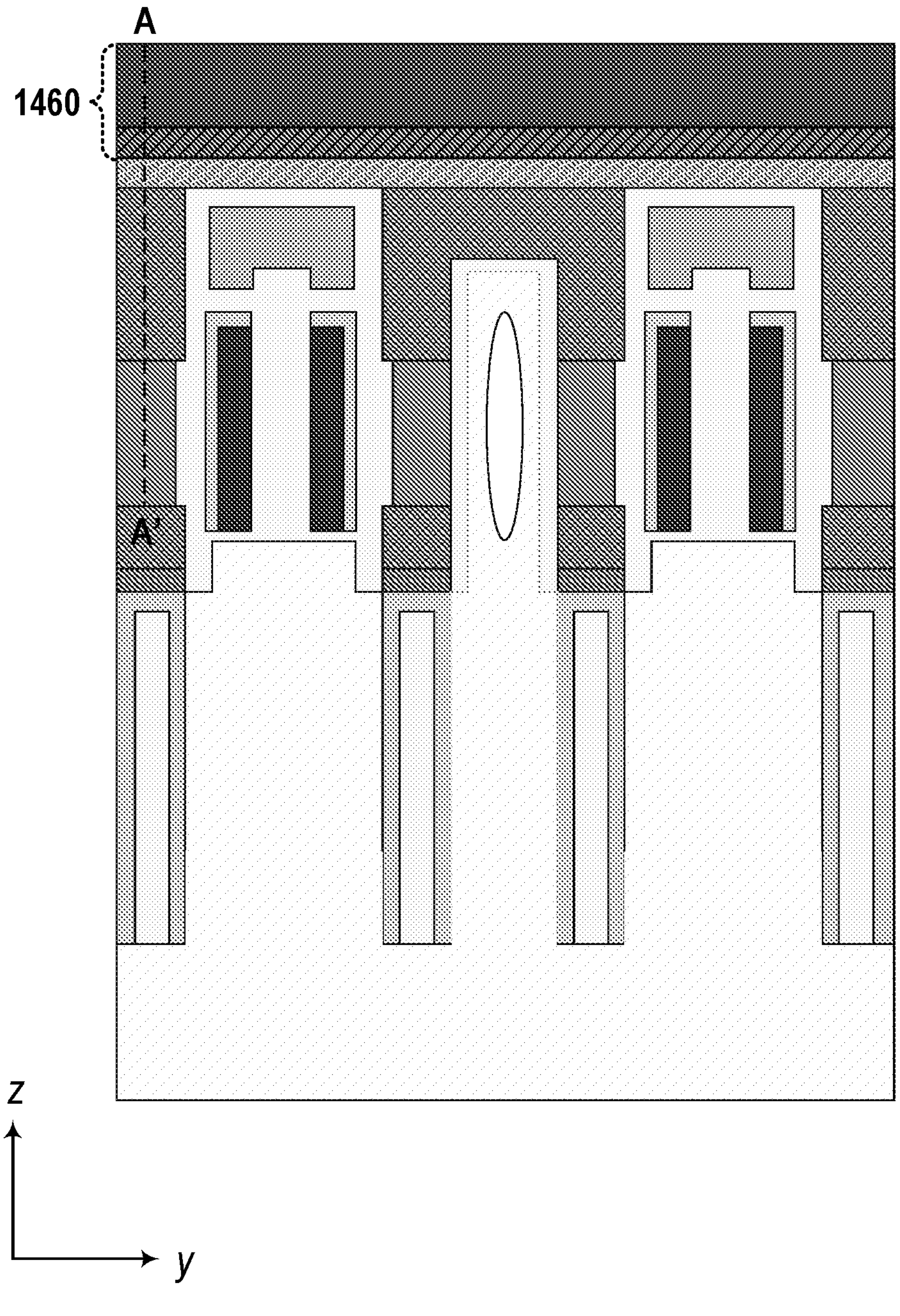
FIGS. 15A-15B each illustrates a schematic side cross-sectional view of a 3D memory device at a certain fabricating stage of the method shown in FIG. 5, according to various implementations of the present disclosure.
Figure 15B:
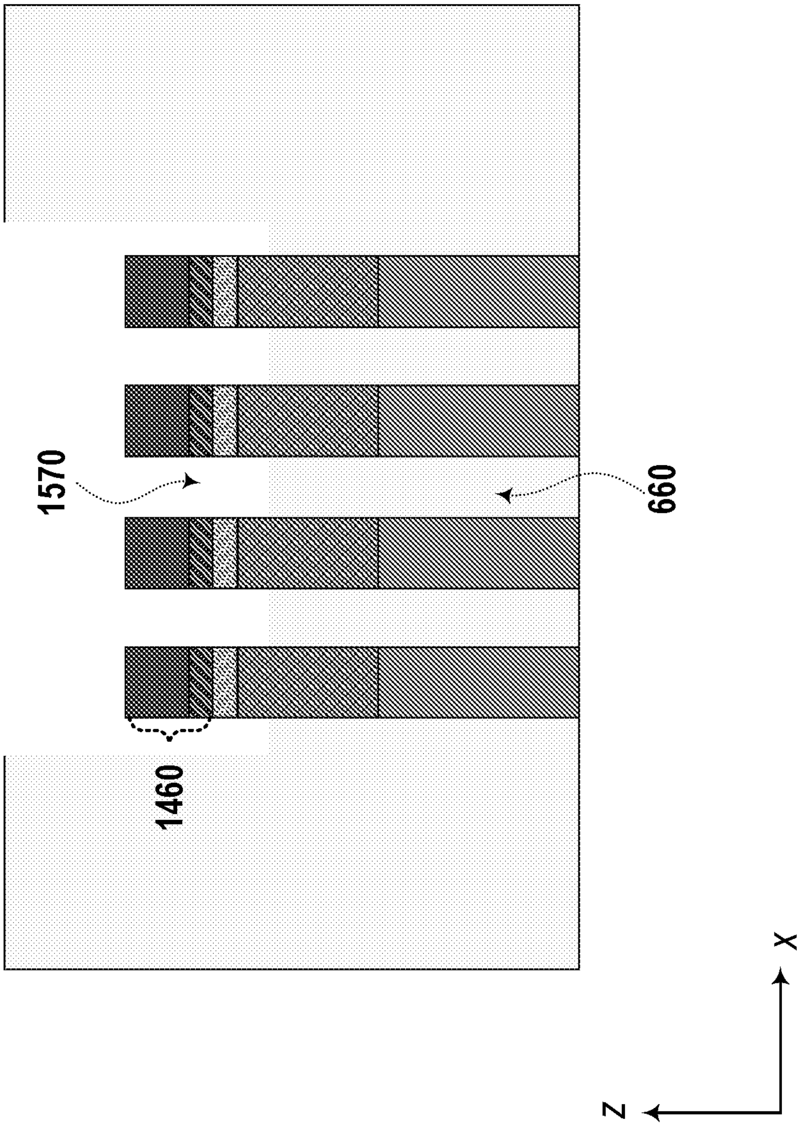
Figure 16A:
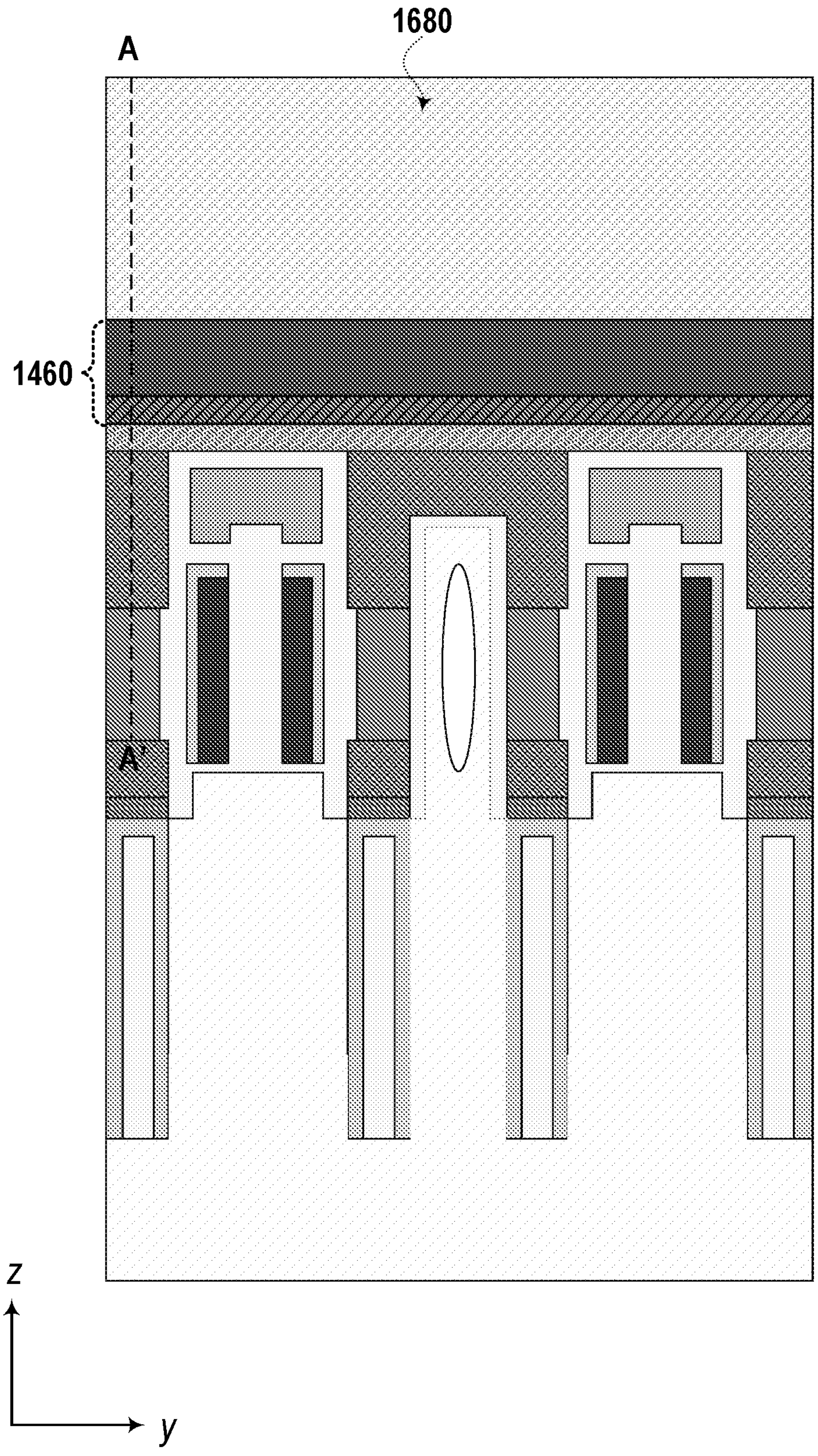
FIGS. 16A-16B each illustrates a schematic side cross-sectional view of a 3D memory device at a certain fabricating stage of the method shown in FIG. 5, according to various implementations of the present disclosure.
Figure 16B:
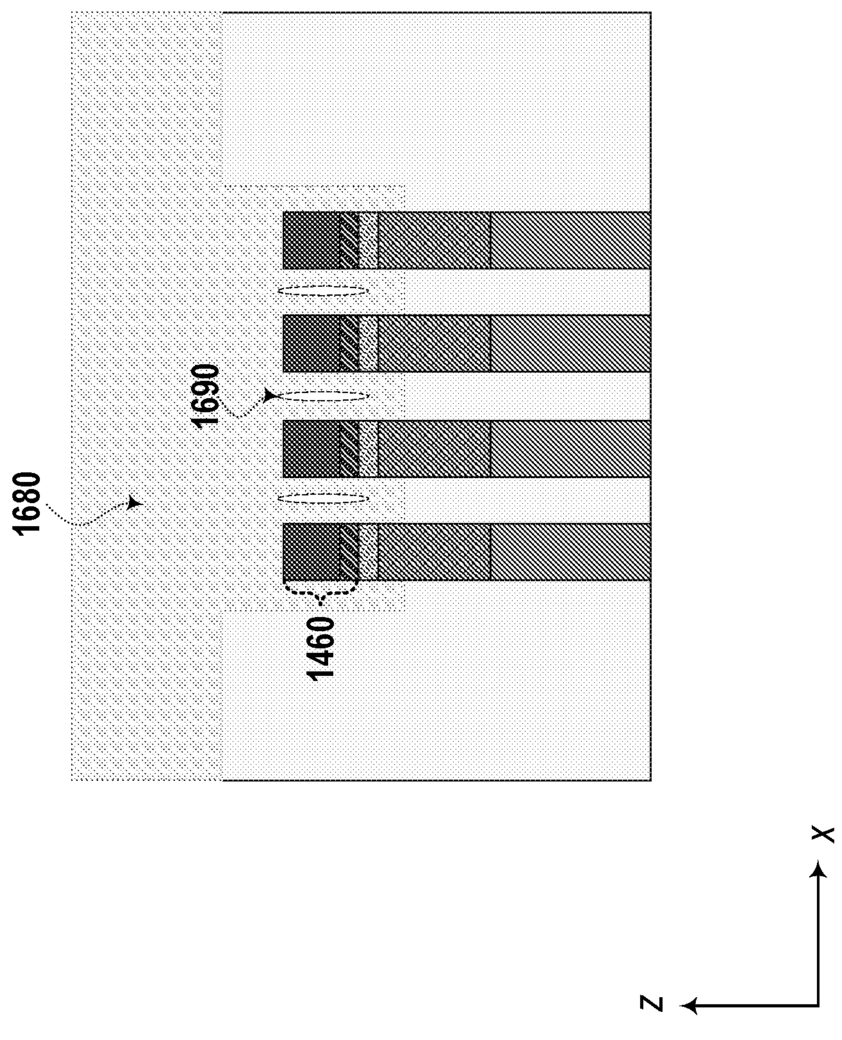

As shown in FIG. 5, method 500 can proceed to operation 580, in which bit line spacers can be formed between adjacent bit lines. FIG. 16A illustrates a schematic side cross-sectional view of the array of memory cells along y-z plane after operation 580 of method 500. FIG. 16B illustrates a schematic side cross-sectional view of the 3D structure in x-z plane along AA' line shown in FIG. 16A, and along BB' line shown in FIG. 2. In some implementations, portions of the third spacers 660 between adjacent bit lines 1460 can be removed by any suitable etching process to form fourth trenches 1570, as shown in FIG. 15B. As shown in FIGS. 16A and 16B, the bit line spacers 1680 can be formed by depositing dielectrics to fill the fourth trenches 1570 using one or more thin film deposition processes including, but not limited to, CVD, PVD, ALD, or any combination thereof. It is understood that in some examples in which the dielectrics include silicon oxide. Depending on the lateral dimensions of fourth trenches 1570, fourth trenches 1570 may not be fully filled with dielectrics (e.g., silicon oxide) when forming the bit line spacers 1680 and thus, become air gaps 1690 between adjacent bit lines 1460.

Figure 17:
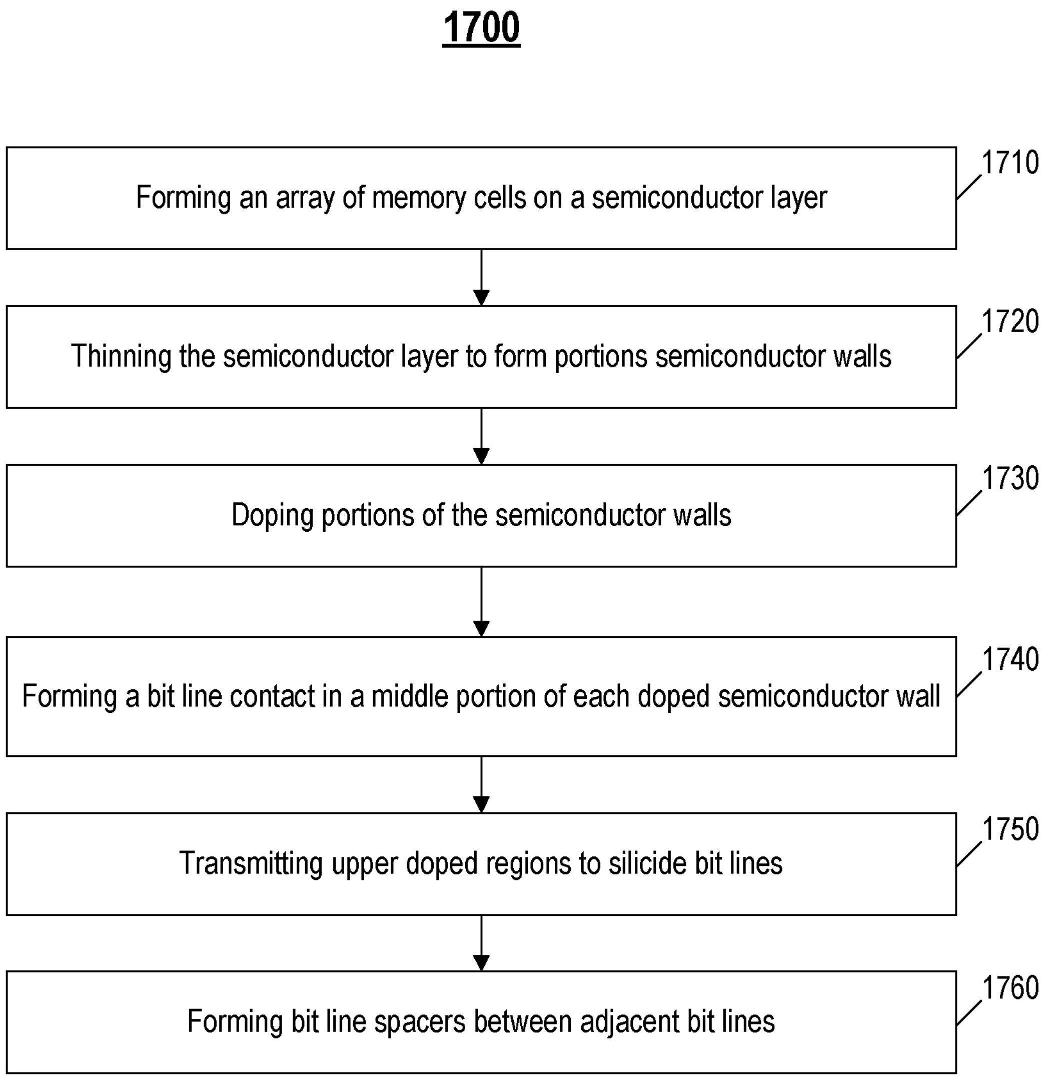
FIG. 17 illustrates a flowchart of a fabricating method for forming a 3D memory device, according to some implementations of the present disclosure.

FIG. 17 illustrates a flowchart of a fabricating method 1700 for forming a 3D memory device including vertical transistors, such as memory device 300B described above in connection with FIG. 3B, according to some implementations of the present disclosure. FIGS. 6A-8B, 7A-7B, 8A-8B, 18A-18B, 19A-19B, and 20A-20B illustrate schematic side cross-sectional views of a 3D memory device at certain fabricating stages of the method 1700 shown in FIG. 17, according to various implementations of the present disclosure. It is understood that the operations shown in method 500 are not exhaustive and that other operations can be performed as well before, after, or between any of the illustrated operations. Further, some of the operations may be performed simultaneously, or in a different order than shown in FIG. 17.

As shown in FIG. 17, method 1700 can start at operation 1710, in which an array of memory cells can be formed on a semiconductor layer. FIG. 6A illustrates a schematic side cross-sectional view of the array of memory cells along y-z plane after operation 1710 of method 1700. FIG. 6B illustrates a schematic side cross-sectional view of the 3D structure in x-z plane along AA' line shown in FIG. 6A. It is noted that some components shown in FIG. 6A are not shown in FIG. 6B.

In some implementations as shown in FIG. 6A, the array of memory cells 610 can include an array of vertical transistors 620 and an array of capacitors 690. Each vertical transistor 620 can include a semiconductor pillar 635 extending vertically (in the z-direction) and have any suitable 3D shape, such as polyhedron shapes or a cylinder shape. That is, the cross-section of each semiconductor pillar 635 in the plan view (e.g., in the x-y plane) can have a square shape, a rectangular shape (or a trapezoidal shape), a circular shape, an oval shape, or any other suitable shapes.

In some implementations, forming the array of semiconductor pillars 635 can include forming a plurality of parallel first spacers 670 and second spacers 680 extending along the first lateral direction (x-direction), as shown in FIG. 6A, and a plurality of parallel third spacers 660 extending along the second lateral direction (y-direction), as shown in FIG. 6B. In some implementations, a lithography process is performed to pattern a plurality of first, second, and third trenches using an etch mask (e.g., a photoresist mask and/or a hard mask), and one or more dry etching and/or wet etching processes, such as RIE, are performed to etch the plurality of first, second, and third trenches in a portion of a semiconductor layer 630. Then the first spacers 670, second spacers 680, and third spacers 660 can be formed by depositing a dielectric material, such as silicon oxide, to fill the third trenches, using a thin film deposition process including, but not limited to, CVD, PVD, ALD, or any combination thereof. The remaining portions of the semiconductor layer 630 form the plurality of semiconductor pillars 635.

As shown in FIG. 6A, forming the array of memory cells 610 can further include forming two conductive structures 625 embedded in each first spacer 670. In some implementations, each conductive structure 625 can be isolated from an adjacent row of semiconductor pillars 635 by a gate dielectric layer 624. The conductive structure 625 can be used as the gate structure of each vertical transistor 620. The conductive structures 625 of a row of vertical transistors 620 extending along the first lateral direction can be connected with each other to form a word line. As shown in FIG. 6A, forming the array of memory cells 610 can further include doping an end of each semiconductor pillar 635 by ion implantation and/or thermal diffusion to form a doped region 628 as a source/drain of the vertical transistor 620. As shown in FIG. 6A, forming the array of memory cells 610 can further include forming the plurality of capacitors 690 each being electrically coupled with the doped region 628 of each semiconductor pillar 635.

As shown in FIG. 17, method 1700 can proceed to operation 1720, in which the semiconductor layer can be thinned. FIG. 7A illustrates a schematic side cross-sectional view of the array of memory cells along y-z plane after operation 1720 of method 1700. FIG. 7B illustrates a schematic side cross-sectional view of the 3D structure in x-z plane along AA' line shown in FIG. 7A. As shown in FIGS. 7A and 7B, semiconductor layer 630 can be thinned from the back side (top side in FIGS. 7A and 7B) by any suitable process, such as a chemical mechanical polishing (CMP) process. As such, along the second lateral direction (y-direction), as shown in FIG. 7B, the remaining undoped portion of the semiconductor layer 630 are separated into a plurality of semiconductor walls 710. It is noted that some components shown in FIG. 7A are not shown in FIG. 7B.

As shown in FIG. 17, method 1700 can proceed to operation 1730, in which the portions of the semiconductor walls can be doped. FIG. 8A illustrates a schematic side cross-sectional view of the array of memory cells along y-z plane after operation 1730 of method 1700. FIG. 8B illustrates a schematic side cross-sectional view of the 3D structure in x-z plane along AA' line shown in FIG. 8A. As shown in FIGS. 8A and 8B, portions of the semiconductor walls 710 can be doped by ion implantation and/or thermal diffusion to form a doped region 822. Doped region 822 can be used as the source/drain of the vertical transistors 620. The remaining undoped region 820 in semiconductor pillars 635 can be used as the channel of the vertical transistors 620. It is noted that some components shown in FIG. 8A are not shown in FIG. 8B.

Figure 18A:
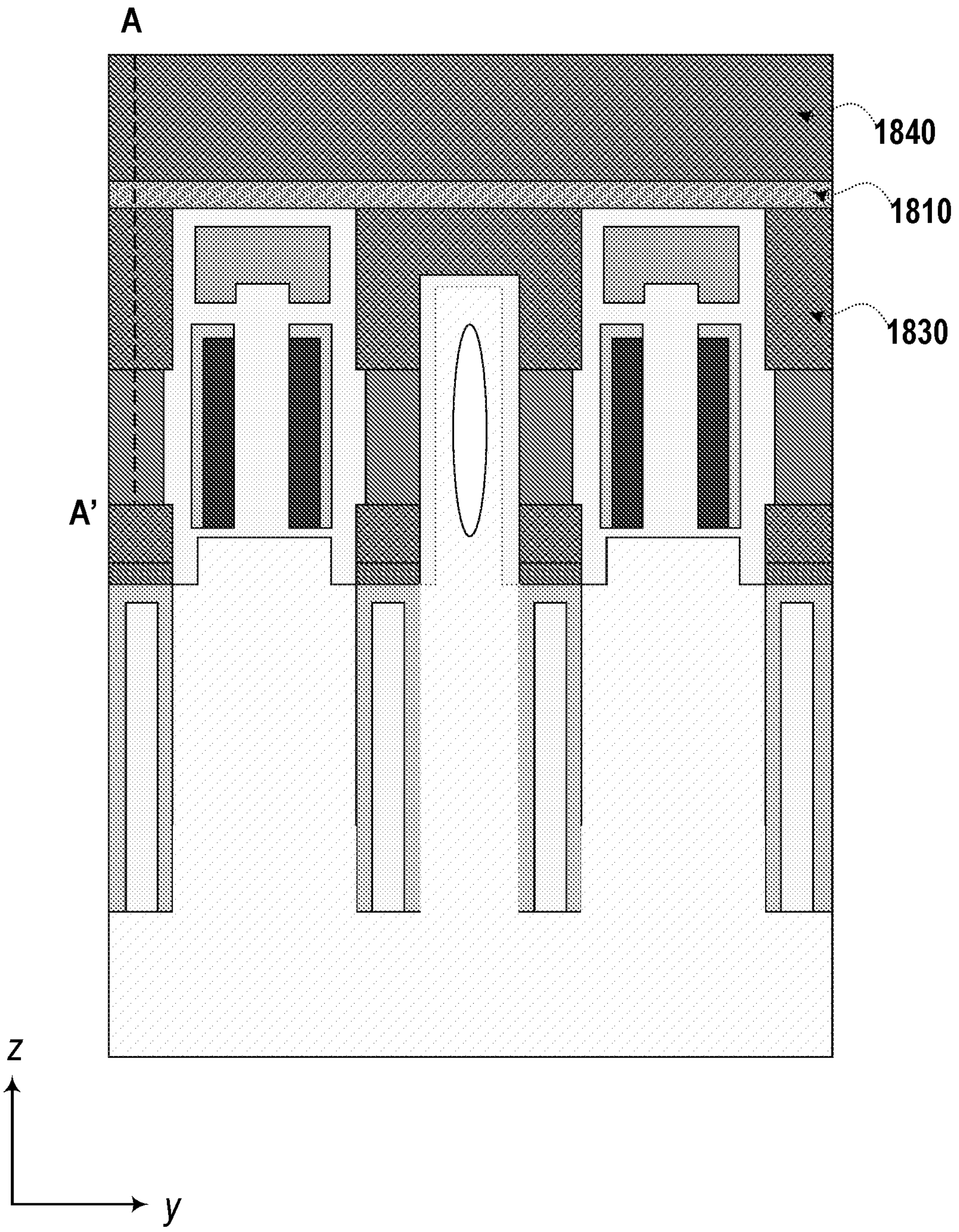
FIGS. 18A-18B each illustrates a schematic side cross-sectional view of a 3D memory device at a certain fabricating stage of the method shown in FIG. 17, according to various implementations of the present disclosure.
Figure 18B:
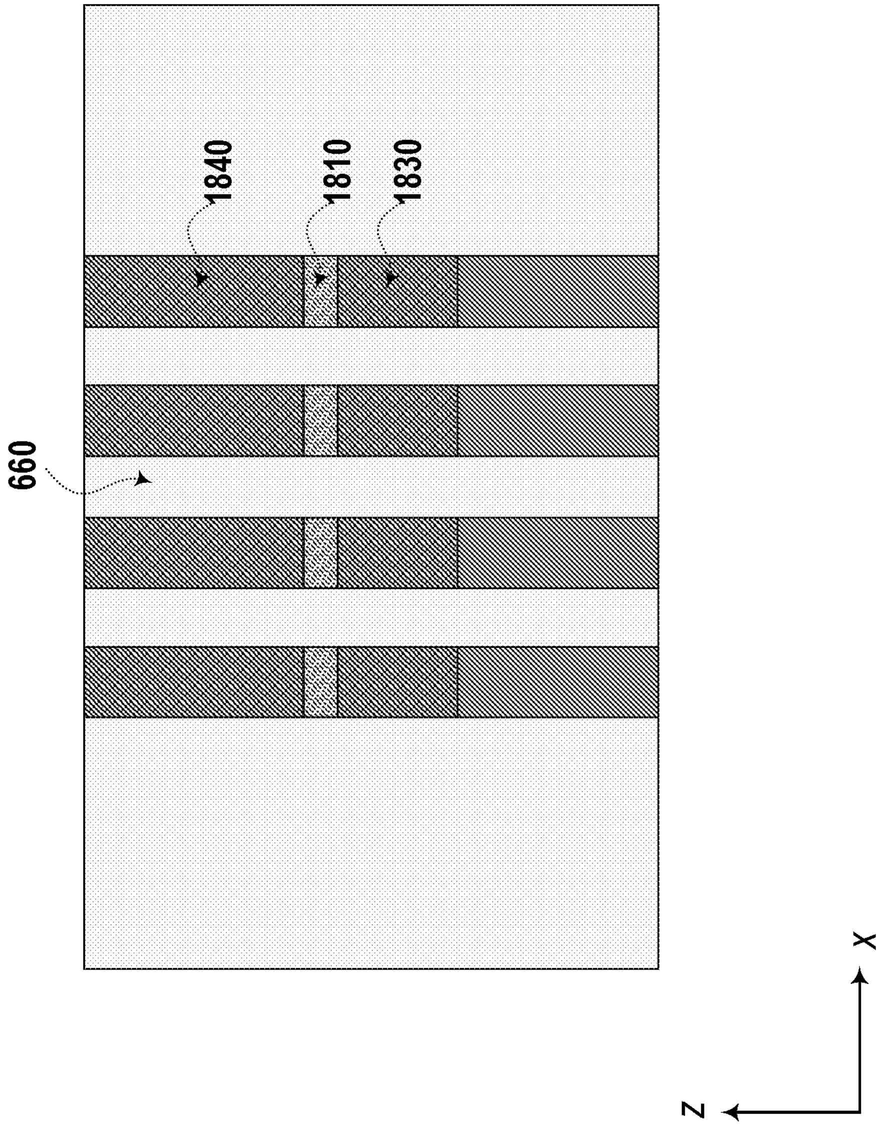

As shown in FIG. 17, method 1700 can proceed to operation 1740, in which a bit line contact can be formed in a middle portion of each doped semiconductor wall. FIG. 18A illustrates a schematic side cross-sectional view of the array of memory cells along y-z plane after operation 1740 of method 1700. FIG. 18B illustrates a schematic side cross-sectional view of the 3D structure in x-z plane along AA' line shown in FIG. 18A. In some implementations, forming the bit line contacts can include forming a heavily doped region 1810 in the middle portion of each doped semiconductor wall, as shown in FIGS. 18A and 18B. A lower doped region 1830 below heavily doped region 1810 can form a common source/drain, an upper doped region 1840 above heavily doped region 1810 can be used to form a bit line in a subsequent process, and the upper doped region 1840 can be used as the bit line contact between the bit line and the common source/drain. It is noted that some components shown in FIGS. 10A and 11A are not shown in FIGS. 10B and 11B.

Figure 19A:
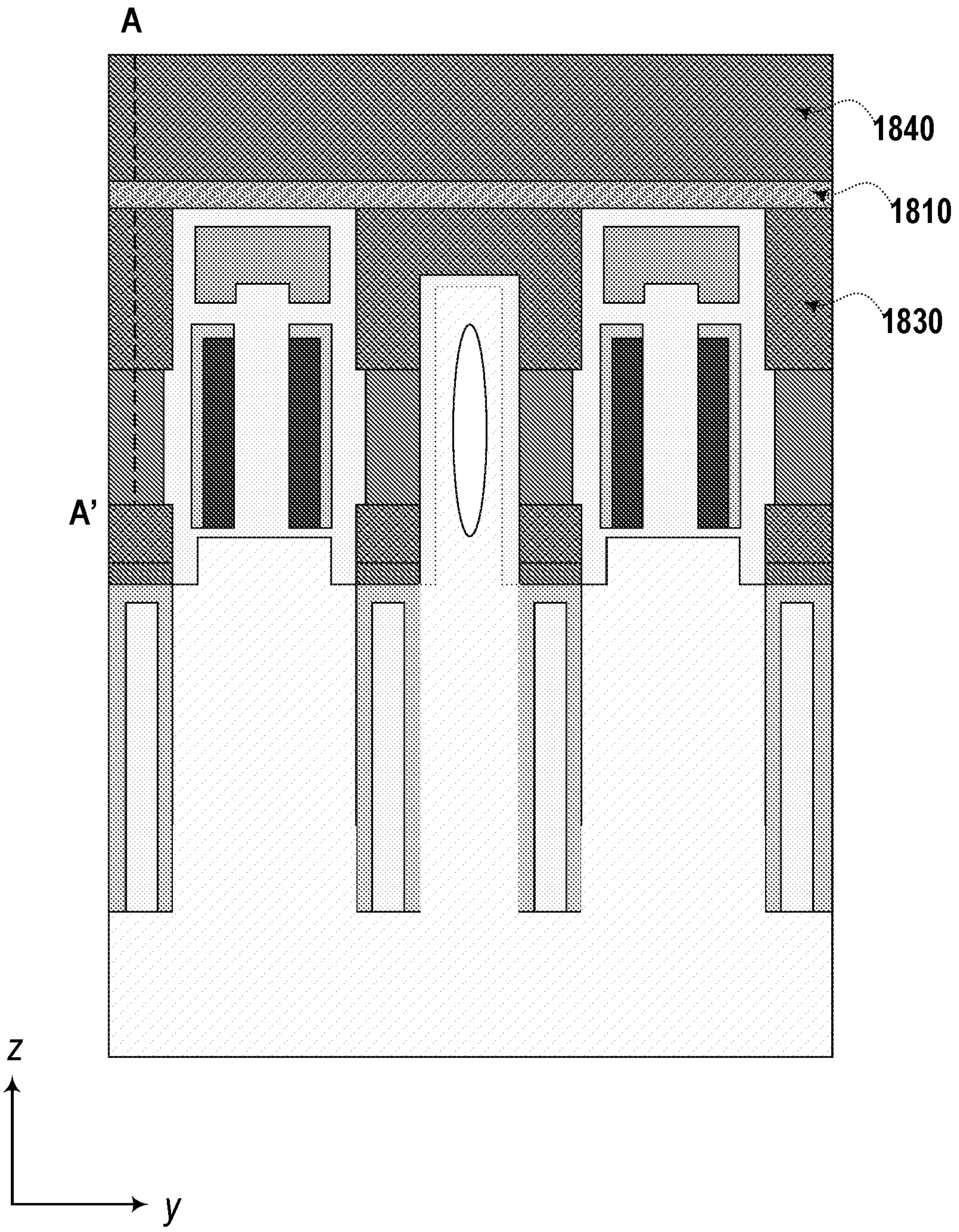
FIGS. 19A-19B each illustrates a schematic side cross-sectional view of a 3D memory device at a certain fabricating stage of the method shown in FIG. 17, according to various implementations of the present disclosure.
Figure 19B:
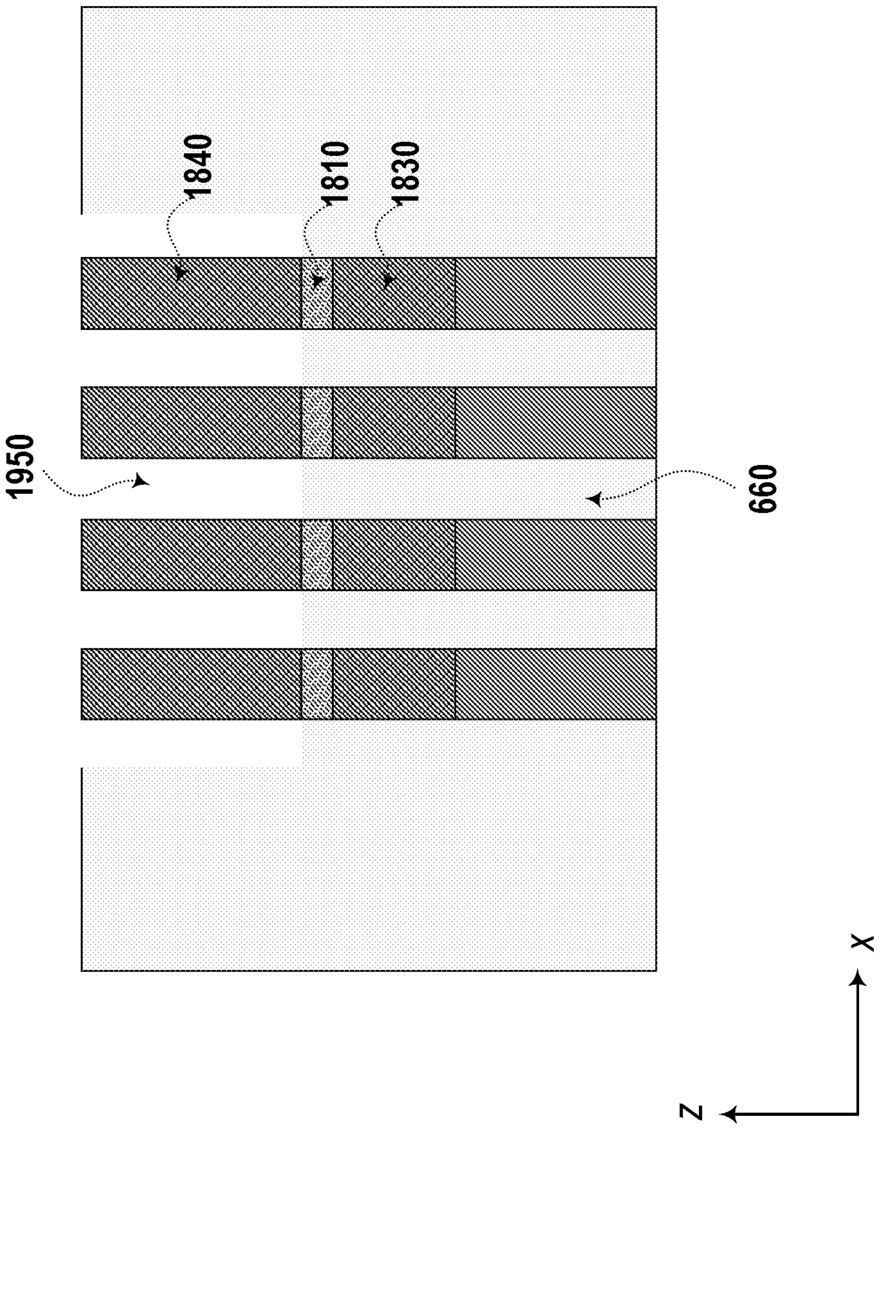
Figure 20A:
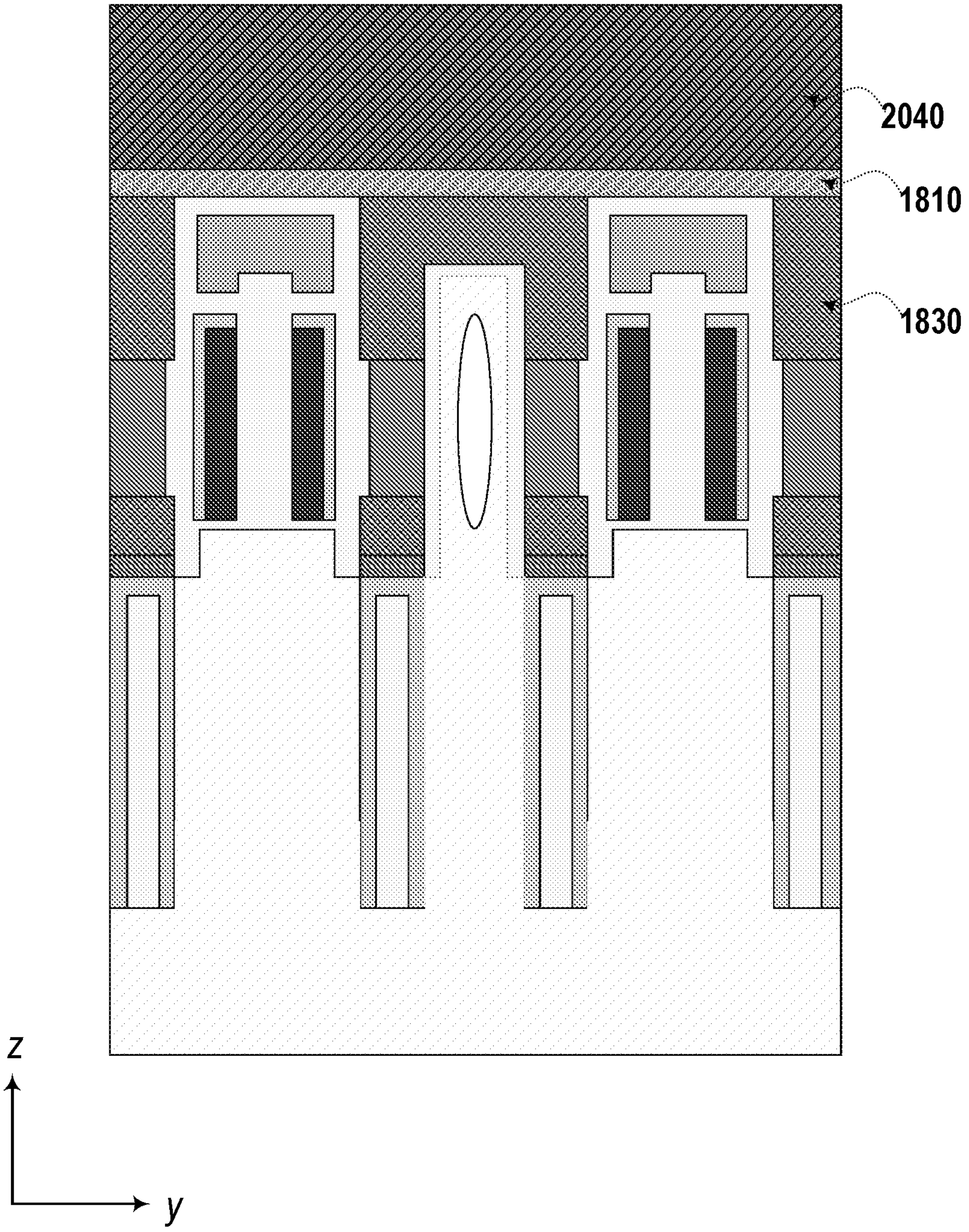
FIGS. 20A-20B each illustrates a schematic side cross-sectional view of a 3D memory device at a certain fabricating stage of the method shown in FIG. 17, according to various implementations of the present disclosure.
Figure 20B:
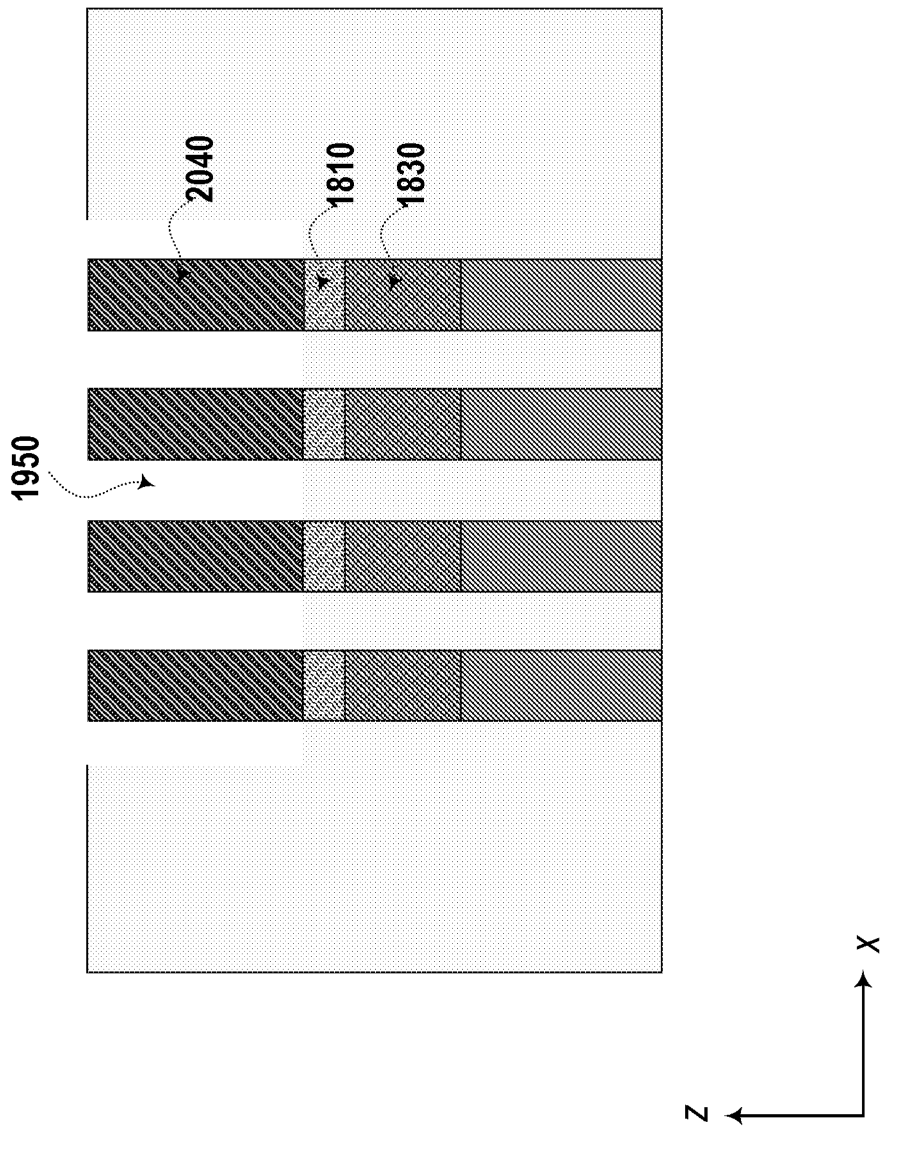

As shown in FIG. 17, method 500 can proceed to operation 1750, in which the upper doped region can be transmitted to a silicide bit line. FIG. 20A illustrates a schematic side cross-sectional view of the array of memory cells along y-z plane after operation 1750 of method 1700. FIG. 20B illustrates a schematic side cross-sectional view of the 3D structure in x-z plane along AA' line shown in FIG. 20A. In some implementations, portions of the third spacers 660 between adjacent bit lines 1460 can be removed by any suitable etching process to form fourth trenches 1950 to expose sidewalls of the upper doped region 1840, as shown in FIG. 19B. In some implementations, a metal silicide layer 2040 can be formed by a metal ion implantation and/or thermal diffusion to the exposed upper doped regions 1840 (also referred as “exposed portion of semiconductor walls”). The metal silicide layer 2040 can be used as a bit line. Since the exposed portion of semiconductor walls are used to form the bit lines, an alignment process for aligning bit lines and corresponding source/drain can be omitted in the disclosed fabricating method. Furthermore, since fourth trenches 1950 are formed before forming the bit lines, the etching process for forming the fourth trenches 1950 has a reduced impact on the formation of the bit lines. It is noted that some components shown in FIGS. 19A and 20A are not shown in FIGS. 19B and 20B.

Figure 21A:
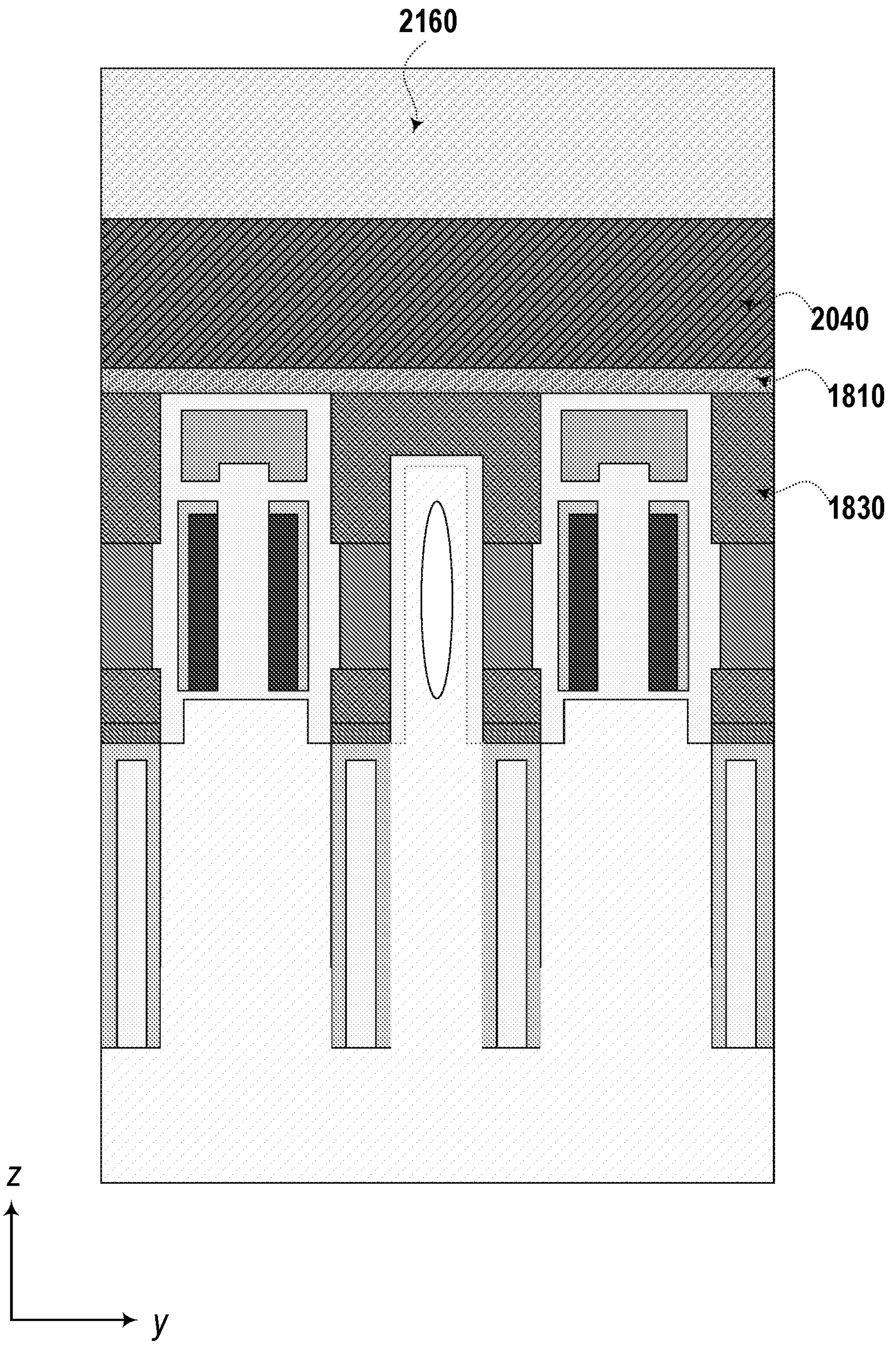
FIGS. 21A-21B each illustrates a schematic side cross-sectional view of a 3D memory device at a certain fabricating stage of the method shown in FIG. 17, according to various implementations of the present disclosure.
Figure 21B:
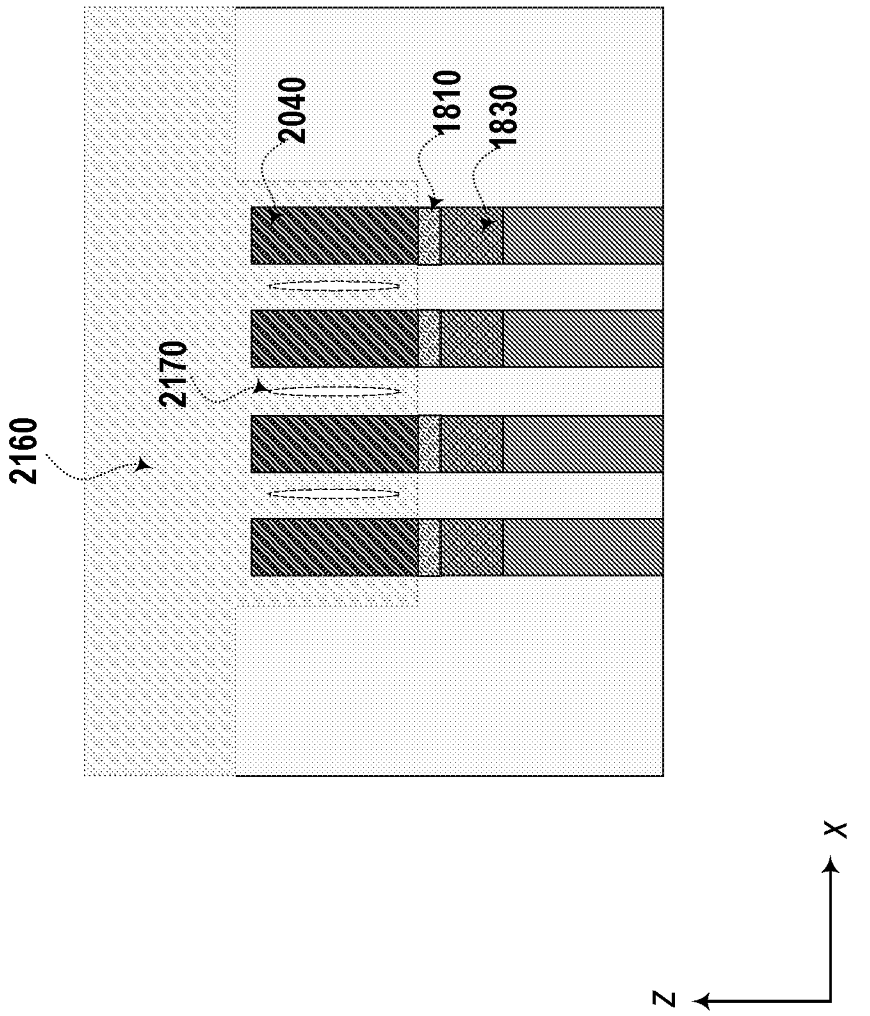

As shown in FIG. 17, method 1700 can proceed to operation 1760, in which bit line spacers can be formed between adjacent bit lines. FIG. 21A illustrates a schematic side cross-sectional view of the array of memory cells along y-z plane after operation 1760 of method 1700. FIG. 21B illustrates a schematic side cross-sectional view of the 3D structure in x-z plane along AA' line shown in FIG. 21A, and along BB' line shown in FIG. 2. In some implementations, the bit line spacers 2160 can be formed by depositing dielectrics to fill the fourth trenches 1950 using one or more thin film deposition processes including, but not limited to, CVD, PVD, ALD, or any combination thereof. It is understood that in some examples in which the dielectrics include silicon oxide. Depending on the lateral dimensions of fourth trenches 1950, fourth trenches 1950 may not be fully filled with dielectrics (e.g., silicon oxide) when forming the bit line spacers 2160 and thus, become air gaps 2170 between adjacent bit lines.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described implementations, but should be defined only in accordance with the following claims and their equivalents.

What is claimed is:

1. A semiconductor device, comprising:

an array of vertical transistors each comprising a semiconductor body extending in a vertical direction;

a plurality of word lines each extending along a first lateral direction and comprising a plurality of gate structures of a row of the array of vertical transistors arranged in the first lateral direction; and a plurality of bit lines each extending along a second lateral direction different from the first lateral direction and comprising silicide, wherein adjacent bit lines are separated by a second air gap extending along the second lateral direction.

2. The semiconductor device of claim 1, wherein:

each bit line comprises a silicide line having a thickness in the vertical direction in a range between about 10 nm and about 30 nm.

3. The semiconductor device of claim 1, wherein:

each bit line comprises a silicide line having a first thickness in the vertical direction and a metal line having a second thickness greater than the first thickness in the vertical direction.

4. The semiconductor device of claim 1, wherein:

the silicide is a metal silicide including at least one element from Co, Ti, and Ni.

5. The semiconductor device of claim 1, further comprising:

an array of memory cells each comprising:

one of the vertical transistors; and a storage unit coupled with a first end of the semiconductor body of the one of the vertical transistors, wherein a second end of the semiconductor body of the one of the vertical transistors is coupled with one corresponding bit line.

6. The semiconductor device of claim 5, wherein:

each bit line is coupled with a common region at the second ends of the semiconductor bodies of a pair of vertical transistors.

7. The semiconductor device of claim 6, wherein:

a plurality of first spacers each extending along the first lateral direction between pairs of the vertical transistors.

8. The semiconductor device of claim 7, wherein:

the plurality of word lines are embedded in the plurality of first spacers; and two adjacent word lines are embedded in one same first spacer.

9. The semiconductor device of claim 7, further comprising:

a plurality of second spacers each extending along the first lateral direction between two rows of the vertical transistors that form pairs of the vertical transistors.

10. The semiconductor device of claim 9, wherein:

the second lateral direction is perpendicular to the first lateral direction; and the plurality of first spacers and second spacers are alternatively arranged along the second lateral direction.

11. The semiconductor device of claim 9, wherein:

each of the plurality of first spacers or second spacers comprises a first air gap extending along the first lateral direction.

12. A semiconductor system, comprising:

an array of memory cells each comprising:

a vertical transistor each comprising a semiconductor body extending in a vertical direction, and a storage unit in electrical connection with a first end of the semiconductor body;

a plurality of word lines each extending along a first lateral direction and comprising a plurality of gate structures of a row of vertical transistors arranged in the first lateral direction; and a plurality of bit lines each extending along a second lateral direction different from the first lateral direction and comprising silicide, wherein adjacent bit lines are separated by a second air gap extending along the second lateral direction; and a memory controller configured to control the array of memory cells through the plurality of word lines and the plurality of bit lines.

13. The semiconductor system of claim 12, wherein:

each bit line comprises a silicide line having a thickness in the vertical direction in a range between about 10 nm and about 30 nm.

14. The semiconductor system of claim 12, wherein:

each bit line comprises a silicide line having a first thickness in the vertical direction and a metal line having a second thickness greater than the first thickness in the vertical direction.

15. The semiconductor system of claim 12, wherein:

the silicide is a metal silicide including at least one element from Co, Ti, and Ni.

16. The semiconductor system of claim 12, wherein:

each bit line is coupled with a common region at second ends of the semiconductor bodies of a pair of vertical transistors.

17. The semiconductor system of claim 16, wherein:

a plurality of first spacers each extending along the first lateral direction between pairs of the vertical transistors.

18. The semiconductor system of claim 17, wherein:

the plurality of word lines are embedded in the plurality of first spacers; and two adjacent word lines are embedded in one same first spacer.

19. The semiconductor system of claim 18, further comprising:

a plurality of second spacers each extending along the first lateral direction between two rows of the vertical transistors that form pairs of the vertical transistors.

20. The semiconductor system of claim 19, wherein:

the second lateral direction is perpendicular to the first lateral direction; and the plurality of first spacers and second spacers are alternatively arranged along the second lateral direction.

21. The semiconductor system of claim 19, wherein:

each of the plurality of first spacers or second spacers comprises a first air gap extending along the first lateral direction.

* * * * *